United States Patent
Rocktäschel

(10) Patent No.: US 9,902,832 B2
(45) Date of Patent: *Feb. 27, 2018

(54) INORGANIC, HALOGEN-FREE FLAMEPROOFING AGENT ON THE BASIS OF CHEMICALLY MODIFIED RECARBONIZED RED MUD

(71) Applicant: FLUORCHEMIE GMBH FRANKFURT, Frankfurt (DE)

(72) Inventor: Christian Rocktäschel, Bergheim (DE)

(73) Assignee: FLUORCHEMIE GMBH FRANKFURT, Frankfurt (DE)

( * ) Notice: Subject to any disclaimer, the term of this patent is extended or adjusted under 35 U.S.C. 154(b) by 131 days.

This patent is subject to a terminal disclaimer.

(21) Appl. No.: 14/762,403

(22) PCT Filed: Jan. 16, 2014

(86) PCT No.: PCT/DE2014/000014
§ 371 (c)(1),
(2) Date: Jul. 21, 2015

(87) PCT Pub. No.: WO2014/114284
PCT Pub. Date: Jul. 31, 2014

(65) Prior Publication Data
US 2015/0353830 A1    Dec. 10, 2015

(30) Foreign Application Priority Data
Jan. 22, 2013  (DE) .................. 10 2013 001 520

(51) Int. Cl.
C08K 3/34      (2006.01)
C09K 21/02     (2006.01)
(Continued)

(52) U.S. Cl.
CPC ............ *C08K 3/0058* (2013.01); *C01F 7/066* (2013.01); *C04B 18/0409* (2013.01); *C05D 3/02* (2013.01);
(Continued)

(58) Field of Classification Search
None
See application file for complete search history.

(56) References Cited

U.S. PATENT DOCUMENTS 2,750,279 A * 6/1956 Lande, Jr. ................. C21C 1/00
                                                        420/29
2,776,205 A * 1/1957 Lande, Jr. ............... C01G 49/10
                                                        252/1

(Continued)

FOREIGN PATENT DOCUMENTS

CA    02829312 A1   9/2012
CN    1414056 A     4/2003
(Continued)

OTHER PUBLICATIONS

Oct. 1, 2014—(WO) International Search Report—App PCT/DE2014/000014.
(Continued)

*Primary Examiner* — Joseph D Anthony
(74) *Attorney, Agent, or Firm* — Banner & Witcoff, Ltd.

(57) ABSTRACT

The disclosure relates to an inorganic, halogen-free flameproofing agent produced from modified, recarbonized red mud (MKRS-HT). The agent may have a mineral composition of 10 to 50 weight % of iron compounds, 12 to 35 weight % of aluminum compounds, 5 to 17 weight % of silicon compounds, 2 to 10 weight % of titanium dioxide, 0.5 to 6 weight % of calcium compounds the weight ratio of Fe (II) carbonate to the oxides of iron being at least 1. The agent, according to examples, can be used as a flame (Continued)

Red Mud 100% retardant in the high-temperature range. The disclosure further relates to flameproofing agent produced from modified, recarbonized and rehydrated red mud, which may be a flame retardant in the low-temperature range as well as in the high-temperature range, methods for producing same and use as flame retardants, substitutes, synergists, thermal stabilizers, heat accumulators, heat insulators and/or sound insulators and/or as electromagnetic radiation shielding materials.

21 Claims, 10 Drawing Sheets

(51) Int. Cl.
| | |
|---|---|
| C09K 5/14 | (2006.01) |
| G10K 11/165 | (2006.01) |
| H05K 9/00 | (2006.01) |
| F16L 59/02 | (2006.01) |
| C08K 3/00 | (2018.01) |
| C08J 9/00 | (2006.01) |
| C05D 3/02 | (2006.01) |
| G10K 11/162 | (2006.01) |
| G21F 1/06 | (2006.01) |
| G21F 1/04 | (2006.01) |
| G21F 1/10 | (2006.01) |
| C09K 8/03 | (2006.01) |
| C01F 7/06 | (2006.01) |
| C05D 9/02 | (2006.01) |
| C05F 7/00 | (2006.01) |
| C04B 18/04 | (2006.01) |
| C08K 11/00 | (2006.01) |
| C04B 103/63 | (2006.01) |

(52) U.S. Cl.
CPC .............. C05D 9/02 (2013.01); C05F 7/005 (2013.01); C08J 9/0066 (2013.01); C08K 3/346 (2013.01); C08K 11/005 (2013.01); C09K 5/14 (2013.01); C09K 8/03 (2013.01); C09K 8/032 (2013.01); C09K 21/02 (2013.01); F16L 59/028 (2013.01); G10K 11/162 (2013.01); G10K 11/165 (2013.01); G21F 1/042 (2013.01); G21F 1/06 (2013.01); G21F 1/103 (2013.01); H05K 9/0081 (2013.01); C01P 2002/72 (2013.01); C01P 2002/88 (2013.01); C01P 2006/12 (2013.01); C04B 2103/63 (2013.01); C08J 2323/08 (2013.01); Y02W 30/91 (2015.05)

(56) References Cited

U.S. PATENT DOCUMENTS

| | | | | | |
|---|---|---|---|---|---|
| 4,226,838 | A | * | 10/1980 | Boros | B01J 23/02 423/121 |
| 4,579,722 | A | * | 4/1986 | Csikos | C01F 7/066 423/120 |
| 6,248,302 | B1 | | 6/2001 | Barnett et al. | |
| 9,487,636 | B2 | * | 11/2016 | Rocktaschel | C08K 3/0058 |
| 2003/0041785 | A1 | * | 3/2003 | Harrison | C04B 28/04 106/801 |
| 2013/0345351 | A1 | | 12/2013 | Rocktaschel et al. | |

FOREIGN PATENT DOCUMENTS

| | | |
|---|---|---|
| CN | 101423306 A | 5/2009 |
| CN | 101624457 A | 1/2010 |
| CN | 102050984 A | 5/2011 |
| CN | 102070815 A | 5/2011 |
| CN | 102585845 A | 7/2012 |
| CN | 102851425 A | 1/2013 |
| DE | 2627504 A1 | 12/1977 |
| FR | 978108 A | 4/1951 |
| JP | S52-051428 A | 4/1977 |
| JP | S54-028347 A | 3/1979 |
| JP | S54-137027 A | 10/1979 |
| JP | S54-141027 A | 11/1979 |
| JP | 57-85854 | 5/1982 |
| JP | H01-106593 U | 7/1989 |
| JP | 07-315830 | 12/1995 |
| JP | H09-506137 A | 6/1997 |
| JP | 09-296116 | 11/1997 |
| JP | 2004-530544 A | 10/2004 |
| JP | 2005-097352 A | 4/2005 |
| JP | 2007-511644 A | 5/2007 |
| JP | 2008-308627 A | 12/2008 |
| JP | 2014-518902 A | 8/2014 |
| RU | 1792951 A1 | 2/1993 |
| SU | 1060656 A1 | 12/1983 |
| WO | 2012126487 A1 | 9/2012 |

OTHER PUBLICATIONS

Dec. 3, 2011—(WO) International Search Report—App PCT/EP2011/001454.

Sunil K. Sharma et al., Fire Technology, Jan. 1, 2002, pp. 57-70, vol. 38, No. 1.

Li, Yun et al, Preparation of Ferric Oxide from Iron Mud through Wetting Method, Journal of Shenyang Institute of Chemical Technology, vol. 22, No. 2, pp. 104-106, Jun. 2008.

Sunil K. Sharma et al: Fire Technology. vol. 38. No. 1. Jan. 1, 2002 (Jan. 1, 2002). pp. 57-70. XP55012990. ISSN: 0015-2684. DOI: 10.1023/A:1013428831840 Introduction; Results and Discussion table 1.

Oct. 1, 2014—(WO) International Search Report—App PCT/DE2014/000013.

Dec. 23, 2011—(WO) International Search Report—App PCT/EP2011/001454.

Yoshikazu Horiguchi et al., Carbonation of aqueous suspension containing red mud, Light Metals, vol. 15, No. 2 (No. 70), pp. 85-91, Mar. 1965.

* cited by examiner

Red mud enriched in goethite content

Red mud with average siderite content

INORGANIC, HALOGEN-FREE FLAMEPROOFING AGENT ON THE BASIS OF CHEMICALLY MODIFIED RECARBONIZED RED MUD

The present application is a U.S. National Phase of International Application No. PCT/DE2014/000014 filed on Jan. 16, 2014, designating the United States of America and claiming priority to German Patent Application No. 102013001520.0 filed on Jan. 22, 2013. This application claims priority to and the benefit of the above-identified applications, each of which is fully incorporated by reference herein.

FIELD OF THE DISCLOSURE

The present disclosure relates to an inorganic, halogen-free flameproofing agent produced from modified, carbonised red mud (MKRS-HT) which can be used as a flame retardant in the high-temperature range, as well as an inorganic, halogen-free flameproofing agent produced from modified, carbonised and rehydrated red mud (MR2S-NT) which can be used as a flameproofing agent both in the low-temperature range and also in the high-temperature range, and also relates to methods for producing same and the use thereof as flame retardants. The disclosure further relates to a fireproofed material system and methods for producing same. Furthermore the flameproofing agent according to the disclosure can be used in further applications, such as for example for heat insulation and for heat storage, for sound insulation and for shielding from electromagnetic waves, as a substitute for barite and as a substitute for antimony trioxide.

BACKGROUND OF THE DISCLOSURE

Flame Inhibition

Flameproofing agents are fire inhibitors which are intended to restrict, slow down or prevent the spread of fires.

Flameproofing agents are used wherever potential sources of ignition are located, or where the use of combustible materials constitutes a safety risk.

Rising demands for safety and the increasing use of high-grade plastics instead of metals and metal alloys, for example in the construction industry, aircraft and automobile manufacture and in interior fittings, have led to an increasing need for flameproofing agents.

The mode of action of flameproofing agents is based on different effects:
  interruption of the radical chain reaction of the gases produced during pyrolysis of the material;
  forming a protective coating of charred material (intumescence), in order to prevent the access of oxygen and heat;
  cooling of the combustion process by initiation of an endothermic decomposition or evaporation of bound water;
  dilution of the combustible gases by inert, gaseous substances (such as for example $CO_2$ which is produced by endothermic decomposition of carbonates;
  liquefaction, i.e. formation of a melt which flows out of the fire zone and simultaneously reduces the surface area.

Most flameproofing agents trigger one or more of the said chemical-physical effects:

Therefore the following 4 types of flameproofing agent are distinguished:

additive flameproofing agents—these are incorporated into the combustible substances;
  reactive flameproofing agents—substances which are themselves components of the material by polymerization into plastic;
  inherent flameproofing agents—the material per se is flame-resistant;
  coating—the flameproofing agent is applied as a coating onto the combustible substance from the outside.

In this case in reactive flameproofing agents there are three different main approaches in order to achieve a certain flameproofing in polymer systems:
  Intumescent FR systems (English: flame retardant): For example melamine derivatives with polymer;
  Halogen-free FR systems: In particular aluminum hydroxide (ATH), magnesium hydroxide (MDH), ammonium polyphosphate (APP); and/or
  Halogen-containing FR systems: For example polyvinyl chloride (PVC) with antimony trioxide ($Sb_2O_3$) and/or organic halogen FR with antimony trioxide ($Sb_2O_3$) and polymer.

Important reactive and inherent, but also additive flameproofing agents have been criticized for toxicological reasons, in particular because of the formation of toxic or environmentally harmful gases during the decomposition process, and are now subject to a strict risk assessment. This applies in particular to halogen-containing flameproofing agents, so that there is a great demand for so-called zero-halogen flame retardants (OHFR fillers) and in particular inorganic flameproofing agents have increasingly gained importance and continue to do so.

Aluminum hydroxide (ATH) is the most important inorganic flameproofing in terms of quantity. Initially ATH was used in polyolefin systems, in particular for so-called wire and cable (W&C) applications.

Since the nineteen-seventies alternatives to these have been increasingly tested, such as for example magnesium hydroxide (MDH), which has a higher decomposition temperature and also has been and is used in systems such as polypropylene and polyamides as OHFR filler. Disadvantages of MDH are, on the one hand, the comparatively high price thereof and, on the other hand, problems which occur at processing temperatures above 300° C., since here the products on the market already decompose while undergoing elimination of water.

At the same time as ATH, ammonium polyphosphate (APP) and its derivatives occurred, but these have inter alia the disadvantage that they are susceptible to moisture content (water immersion tests in electrical components) and already release ammonia at a temperature of 170° C.

In the technical thermoplastics, such as for example polyamides and polyesters, melamine derivatives such as melamine isocyanurate, melamine cyanurate and melamine polyphosphate have been used in addition to magnesium hydroxide.

Furthermore at load factors of up to 65% by weight of the respective OHFR filler in the flameproof polymer compound, which may be necessary for example in order to achieve a required fire class (for example UL 94 vertical V-0), technical problems occur with regard to processing (extrusion behavior) as well as property profile problems (decrease in the mechanical and electrical values by comparison with the unfilled polymer). These difficulties increase at even higher load factors—virtually exponentially—and make maximum demands on compounding equipment and operators. This statement applies to an even greater extent for the so-called Construction Protection Directive ("CPD") (cf. prEN 50399), which for classification of the FR compounds into the so-called "Euro Classes" again necessitates more stringent applications of new FR tests. At such high degrees of filling, flameproof polymer compounds can no longer be technically implemented in practice and can no longer be processed. Furthermore, during the development of CPD-compliant OHFR polymer compounds the use of so-called nanoclays as synergists has been described and for example introduced technically into the market under the trade marks Cloisite® and Nanofil®.

Since the polymer compound systems resulting therefrom have become increasingly complex and expensive, the inventors of the present invention have taken a completely different route.

It is known that red mud, which is produced as a waste product in the Bayer process for extracting aluminum hydroxide (ATH) from bauxite, has profound OHFR characteristics. Therefore in the following description red mud (RM) is understood to be the residue from the Bayer process which is produced in the extraction of ATH from bauxite.

Red mud (RM), which may to some extent be represented as bauxite minus ATH, is an extremely heterogeneous substance with regard to its chemical and mineralogical composition, its endothermic properties, its pH value, etc. The cause of the heterogeneity sometimes lies in the differing composition the bauxites used, but above all in whether the Bayer process operates by autoclave digestion or by tube digestion. In the autoclave process the digestion is carried out with 30 to 35% caustic soda solution at temperatures of 170-180° C., so that a pressure of 6 to 8 bars is established. The tube digestion process was developed in order to shorten the reaction time of 6 to 8 hours to less than 1 hour by increasing the temperature to 270° C. However, at this temperature a water vapor pressure of 60 bars is established at the end of the reactor. The higher temperatures of the tube digestion also influence the composition of the red mud. For example, in the iron hydroxide/oxide hydroxide system in the tube digestion process the balance is shifted almost completely towards hematite ($Fe_2O_3$). Because of the heterogeneity of the red mud (RM) the economically viable possibilities for use thereof is restricted, so that it must be predominantly disposed of as waste at disposal sites.

In WO 2012/126487 A1 an OHFR-system based upon modified rehydrated red mud (MR2S) is described, which is suitable as a cost-effective OHFR system for technical applications in the wire and cable field or for constructional and plastics processing applications. With the aid of the modified rehydrated red mud disclosed in WO 2012/126487 A1 a flame-retardant effect can be achieved in the temperature range from approximately 200° C.-350° C. The flame-retardant effect comes about due to the fact that the hydroxides and oxide hydroxides of aluminum and iron—such as for example gibbsite and boehmite or goethite—which are produced in the rehydration of the red mud decompose in oxides and water. Such products have applications for example in polymer systems such as PVC or EVA (PE). Products such as ATH or APP hitherto used in the market react between 180° C. and 220° C. and are regarded as low-temperature products. Between 220° C. and 340° C. products such as MDH and brucite are used which are regarded as high-temperature products. The flame retardants (MR2S) produced from RM by rehydration react between approximately 220° C. and 350° C. and thus according to the currently customary definition covers both the low-temperature and the high-temperature range.

However, within the context of the present disclosure the temperature range between 220° C. and 350° C. is classified as the low-temperature range, MR2S acquires the suffix NT (low temperature) and thus is called MR2S-NT.

However, there is an increasing need for substances which exhibit their flame-retardant effect in higher temperature ranges, so-called high-temperature (HT) flame retardants. Within the context of the present disclosure the temperature range between 350° C. and 500° C. is classified as the high-temperature range.

BRIEF SUMMARY OF THE DISCLOSURE

Therefore the object of certain present embodiments is to provide a cost-effective halogen-free flameproofing agent which exhibits a flame-retardant effect in the high-temperature range, in a particularly advantageous manner both in the high-temperature range and also in the low-temperature range.

Surprisingly it has been found that an OHFR system which is suitable for the high-temperature range can be produced from red mud by a modification different from the rehydration described in WO 2012/126487 A1, namely by a recarbonization.

By reduction of red mud in an acidic medium it is possible to obtain from the Fe (III) compounds present in the red mud Fe (II) salt solutions, from which iron (II) carbonate (siderite) can be precipitated by addition of for example $NaHCO_3$, $Na_2CO_3$ or $CaCO_3$. Without wishing to be tied to a theory, it is assumed that by a recarbonization of red mud with the formation of iron (II) carbonate a high-temperature (HT) flameproofing agent can be obtained which exhibits its endothermic effect by cleavage into oxide and $CO_2$ up to temperatures of more than 500° C. In addition to the endothermic reaction acts the released $CO_2$ acts as a flameproofing agent.

Examples of present embodiments therefore relate to an inorganic, halogen-free flameproofing agent produced from modified, recarbonized red mud (MKRS-HT) with a mineral composition of 10 to 50% by weight of iron compounds,
12 to 35% by weight of aluminum compounds,
5 to 17% by weight of silicon compounds,
2 to 10% by weight of titanium dioxide,
0.5 to 6% by weight of calcium compounds, and
where appropriate unavoidable impurities,
wherein the weight ratio of Fe (II) carbonate to the oxides of iron is at least 1.

Since this product is produced by recarbonization, it is given the name MKRS (modified recarbonized red mud). Since this is a high-temperature flame retardant, it is given the suffix HT (high-temperature), and thus its designation is MKRS-HT.

Furthermore it has been found that a particularly advantageous inorganic, halogen-free flameproofing agent, which is suitable both for the high-temperature range and also for the low-temperature range and thus constitutes a universally usable flame retardant for a very broad temperature range, can be obtained from red mud by rehydration as well as recarbonization.

Examples of the present embodiments therefore relate to an inorganic, halogen-free flameproofing agent produced from modified, recarbonized and rehydrated red mud with a mineral composition of 10 to 50% by weight of iron compounds,
12 to 35% by weight of aluminum compounds,
5 to 17% by weight of silicon compounds, 2 to 10% by weight of titanium dioxide, 0.5 to 6% by weight of calcium compounds, and where appropriate unavoidable impurities, wherein the weight ratio of Fe (II) carbonate and the weight ratio of the sum of iron hydroxide and iron oxide hydroxide to the oxides of iron is at least 1.

In this case, in addition to the hydroxides/oxide hydroxides of the iron and Fe (II) carbonate, hydroxides/oxide hydroxides of the aluminum are preferably also present which can produce a further intensification of the flame-retardant effect on the basis of its endothermic characteristics. In addition, phase transformations into different constituents of the red mud can take effect endothermally. Overall, in polymer compounds equipped with such OHFR products according to the invention endothermic reactions proceed over a temperature range of 180° C. up to more than 500° C. Additionally flame-retardant $CO_2$ is released.

The present disclosure further relates to a method for producing the inorganic, halogen-free flameproofing agent produced from modified, recarbonized red mud (MKRS-HT), with examples of the method comprising the steps of:

a) providing red mud, b) reducing the iron (III) compounds contained in the red mud in acidic solution to iron (II) compounds, c) adding a carbonate compound to the solution containing iron (II) compounds obtained in step b), wherein iron (II) carbonate (siderite) is formed.

The present disclosure further relates to a method for producing the inorganic, halogen-free flameproofing agent produced from modified red mud, with examples of the method comprising the steps of:

a) providing red mud (RM), b) separately producing iron (II) carbonate from available starting substances;

c) mixing RM and iron (II) carbonate;

d) obtaining modified carbonised red mud (MKRS-HT).

In this way the iron (II) carbonate can be easily subjected to modifications by physical and/or chemical methods in order to achieve special application-specific characteristics.

The present disclosure further relates to a fireproofed material system, with examples of the system comprising a combustible material and a flameproofing agent according to this disclosure.

The present disclosure further relates to the use of a flameproofing agent according to the disclosure as flame retardant for combustible materials, in particular combustible building materials, rubber, chipboard material, plastics, in particular cable sheathings, cable insulation compound or cable filling compounds.

The present disclosure further relates to a method for producing a fireproofed material system, examples of the method comprising the steps of:

a) providing a combustible material, b) coating or blending the combustible material with a flameproofing agent according to the invention, and thereby c) obtaining the fireproofed material system.

Furthermore it has been found that chemically modified, rehydrated and recarbonized red mud as well as mixtures thereof has a density of approximately 3.8-3.9 $10^3$ kg/m$^3$ and thus close to $BaSO_4$ (barite), which has a density of 4.43 $10^3$ kg/m$^3$. Because of its specific weight $BaSO_4$ is also used inter alia as a heavy filler in plastics. If red mud or its chemically modified variants MR2S-NT or MKRS-HT or mixtures thereof are now used instead of barite, plastic compounded in this way simultaneously acquires a flame-retardant characteristic, and thus a double effect occurs.

Furthermore chemically modified, rehydrated and recarbonized red mud, as well as mixtures thereof in conjunction with a carrier matrix exhibit a sound-insulating effect. Thus if plastics or for example building materials are provided with these products, in addition to the flame-retardant effect a sound-insulating effect also occurs. This double effect is of particular interest when used in automobile manufacture and the construction industry. Building materials may also be mineral products such as screed, concrete, gypsum plasterboards, etc., which then have a corresponding sound insulation.

Furthermore the present disclosure relates to the advantageous use of the flameproofing agent according to the disclosure and/or mixtures thereof, in particular mixtures with red mud, as filler, substitute or surrogate, synergist, thermal stabilizer, heat accumulator, heatproofing, heat insulator, sound insulator, soundproofing and/or as material for attenuating or shielding from electromagnetic radiation.

Advantageous further developments of the present disclosure are in each case the subject matter of subordinate claims and embodiments.

Embodiments according to the present disclosure may have one or more of the features referred to below.

Some or all of the embodiments according to the present disclosure may have one, several or all of the advantages referred to below.

DETAILED DESCRIPTION OF THE DISCLOSURE

Figure 1:
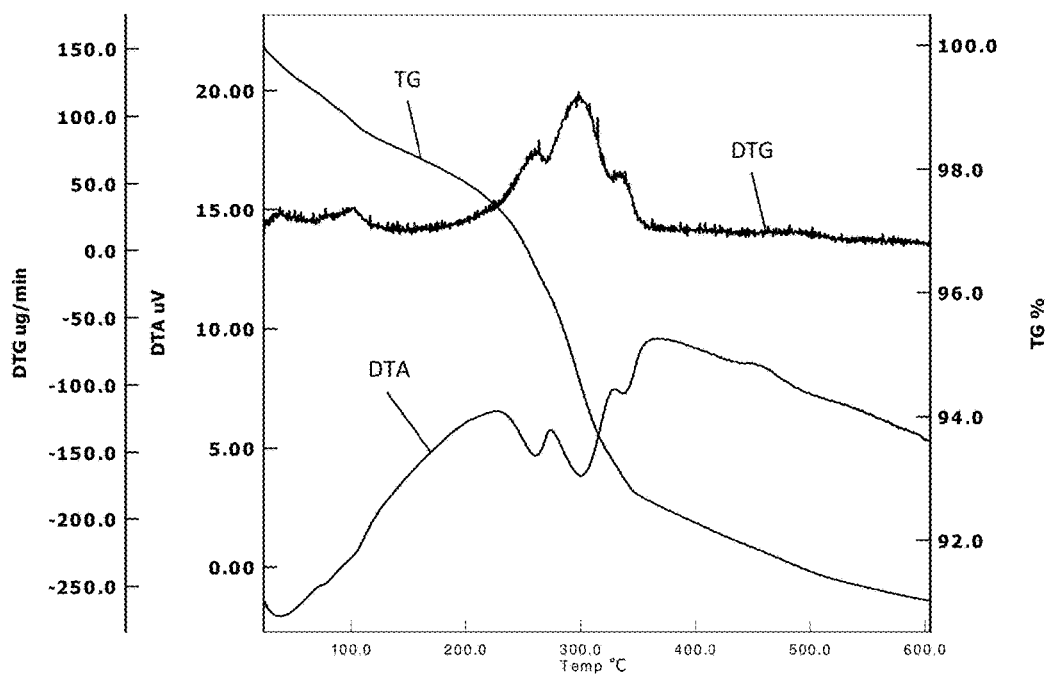
FIG. 1 shows differential thermoanalysis and thermogravimetg curves of an example red mud.

The terms "flameproofing agent", "flame-retardant agent", "flame retardant" and "OHFR agents" or also the abbreviation "FR" (English: flame retardant) should be understood as synonyms within the context of the present. These are understood within the context of the present disclosure to include in particular non-toxic, halogen-free inorganic flameproofing agents, in particular modified recarbonized red mud (MKRS-HT) or modified, recarbonized and rehydrated red mud.

Within the context of the present disclosure the "low-temperature range" is understood to be the temperature range between 220° C. and 350° C.

Within the context of the present disclosure the "high-temperature range" is understood to be the temperature range between 350° C. and 500° C.

The term "fireproofed material system" is understood to mean an object in which a combustible material is brought into contact with a flame-retardant agent so that the ignition of the combustible material present in the object by fire or heat is prevented or slowed down. In particular the flame-retardant agent is permanently associated with the combustible material, for example by blending or coating.

"Combustible materials" or "flammable materials" are understood to be any materials which are combustible or flammable, in particular polymers and non-volatile hydrocarbons. Examples are acrylic dispersions, acrylic resins, elastomers, epoxy resins, latex dispersions, melamine resins, polyamide (PA), polyethylene (PE), PE copolymers, thermoplastic PE copolymers, cross-linked PE copolymers, phenolic resins, polyester resins (UP), polyurethane, polypropylene (PP), polyvinyl chloride (PVC), PVC plastisols, thermoplastic elastomers such as for example TPE, TPA, TPU, etc., vinyl ester resins and bitumen. "Combustible" and "flammable" should be understood here as synonyms.

Red mud (RM) is understood to be the residue from the Bayer process which is produced in the extraction of ATH from bauxite. Further information concerning red mud may be found in WO 2012/126487 A1, the disclosure of which is hereby incorporated as an integral part of this application. Modified recarbonized red mud (MKRS-HT) is understood to be a product which is produced from red mud (RM) by recarbonization and optionally drying, grinding, admixture of other substances, coating of the surface, etc. Modified recarbonized and rehydrated red mud is understood to be a product which is produced from red mud (RM) by recarbonization as well as rehydration and optionally drying, grinding, admixture of other substances, coating of the surface, etc.

Examples of present disclosure relate to an inorganic, halogen-free flameproofing agent produced from modified, recarbonized red mud (MKRS-Hat) with a mineral composition of 10 to 50% by weight of iron compounds,
12 to 35% by weight of aluminum compounds,
5 to 17% by weight of silicon compounds,
2 to 10% by weight of titanium dioxide,
0.5 to 6% by weight of calcium compounds, and
where appropriate unavoidable impurities, wherein the weight ratio of Fe (II) carbonate to the oxides of iron is at least 1.

In the inorganic, halogen-free flameproofing agent produced from modified, recarbonized red mud (MKRS-HT) the weight ratio of Fe (II) carbonate to the oxides of iron is preferably at least 1, more preferably at least 2, more preferably at least 3, more preferably at least 4, more preferably at least 5, more preferably at least 7, more preferably at least 9, more preferably at least 19. For clarification, if for example the weight ratio of Fe (II) carbonate to the oxides of iron amounts to 19 and assuming that all the iron compounds are present either as Fe (II) carbonate or as oxides of iron, 95% by weight of the iron compounds are present as Fe (II) carbonate and 5% by weight of the iron compounds are present as oxides of iron.

The present invention further relates to an inorganic, halogen-free flameproofing agent produced from modified, recarbonized and rehydrated red mud (MR2S-NT) with a mineral composition, in some examples, of 10 to 50% by weight of iron compounds, 12 to 35% by weight of aluminum compounds,
5 to 17% by weight of silicon compounds,
2 to 10% by weight of titanium dioxide,
0.5 to 6% by weight of calcium compounds, and
where appropriate unavoidable impurities, wherein the weight ratio of Fe (II) carbonate and the weight ratio of the sum of iron hydroxide and iron oxide hydroxide to the oxides of iron is at least 1.

In the inorganic, halogen-free flameproofing agent produced from modified, recarbonized and rehydrated red mud the weight ratio of Fe (II) carbonate and iron hydroxide/oxide hydroxides to the oxides of iron is preferably at least 1, more preferably at least 2, more preferably at least 3, more preferably at least 4, more preferably at least 5, more preferably at least 7, more preferably at least 9, more preferably at least 19.

For clarification, if for example the weight ratio of Fe (II) carbonate to the oxides of iron amounts to 2 and the weight ratio of the sum of iron hydroxide and iron oxide hydroxide to the oxides of iron also amounts to 2 and assuming that all the iron compounds are present either as Fe (II) carbonate, iron hydroxide, iron oxide hydroxide or as oxides of iron, 40% by weight of the iron compounds are present as Fe (II) carbonate, 40% by weight of the iron compounds are present as iron hydroxide or iron oxide hydroxide and 20% by weight of the iron compounds are present as oxides of iron.

In the inorganic, halogen-free flameproofing agent produced from modified, recarbonized and rehydrated red mud, in addition to the hydroxides/oxide hydroxides of the iron and Fe (II) carbonate, hydroxides/oxide hydroxides of the aluminum are preferably also present which can produce a further intensification of the flame-retardant effect on the basis of its endothermic characteristics. In this case the weight ratio of the sum of aluminum hydroxide and aluminum oxide hydroxide to aluminum oxide is preferably at least 1, more preferably at least 1.5, more preferably at least 2, more preferably at least 3, more preferably at least 4, more preferably at least 5, more preferably at least 7, more preferably at least 9, more preferably at least 19.

Unless explicitly noted otherwise, the following statements apply both to the inorganic, halogen-free flameproofing agents produced from modified, recarbonized red mud (MKRS-HT) and also to the inorganic, halogen-free flameproofing agents according to the invention produced from modified, recarbonized and rehydrated red mud (MR2S-NT), which taken together are also designated below simply as "modified red mud" or "flameproofing agent (according to the disclosure)".

The mineral composition of the modified red mud comprises:

10 to 50% by weight of iron compounds,
12 to 35% by weight of aluminum compounds,
5 to 17% by weight of silicon compounds, 2 to 10% by weight of titanium dioxide,
0.5 to 6% by weight of calcium compounds, and
where appropriate unavoidable impurities, In this case the mineral composition of the modified red mud may comprise 10 to 45, 30 to 50, or 20 to 40% by weight of iron compounds.

In this case the mineral composition may comprise 12 to 30, 20 to 35, or 15 to 25% by weight of aluminum compounds.

In this case the mineral composition may comprise 5 to 15, 8 to 17, or 7 to 16% by weight of silicon compounds, in particular $SiO_2$.

In this case the mineral composition may comprise 4 to 10, 2 to 8, or 3 to 9% by weight of titanium dioxide ($TiO_2$).

In this case the mineral composition may comprise 1 to 6, 0.5 to 2.5, or 0.6 to 1.5% by weight of calcium compounds, in particular CaO.

In this case each of the ranges given above may be combined.

"Unavoidable impurities" are understood to be constituents which occur as impurities in the starting materials, for example in the bauxite subjected to a Bayer process, or impurities which are produced or introduced in the product due to manufacturing tolerances. In particular due to the heterogeneity of the red mud, as mentioned in the introduction, such impurities are inevitable. However they do not contribute decisively to the flame-retardant effect of the modified red mud.

In a modification of examples of the disclosure the proportion of water-soluble sodium compounds, expressed in percentage by weight of $Na_2O$, in the modified red mud is no more than 0.03, preferably 0.003 to 0.03% by weight.

In a further modification of examples of the disclosure the average particle size (d50) in the modified red mud is no more than 50 µm, preferably 0.5 to 10 µm or 1 to 5 µm (modified red mud on a microscale) or 100 to 900 nm or 200 to 750 nm (modified red mud on a nanoscale).

In a further modification of examples of the disclosure the residual moisture content of the modified red mud amounts to no more than 0.4% by weight, preferably no more than 0.3% by weight, preferably no more than 0.2% by weight.

The chemical composition of red mud is set out in Table 1, the chemical composition of MKRS-HT is set out in Table 2 and the chemical composition of modified, recarbonized and rehydrated red mud is set out in Table 3 (MR2S-NT).

TABLE 1

Red mud (percent by weight)

| | Typical | Bandwidth |
|---|---|---|
| Iron compounds | 40 | 10-50 |
| Aluminum compounds | 25 | 12-35 |
| Silicon compounds (esp. $SiO_2$) | 15 | 5-17 |
| Titanium dioxide | 7 | 2-10 |
| Calcium compounds | 1 | 0.5-6 |
| Sodium compounds | 9 | 3-10 |
| Other | 3 | 0-3 |

TABLE 2

MKRS-HT

| | |
|---|---|
| iron compounds | weight ratio of Fe (II) carbonate to the oxides of iron at least 1 |
| aluminum compounds | unchanged as Al salts or $Al_2O_3$ |
| $Na_2O$ soluble | preferably less than or equal to 0.03% by weight |
| other constituents of the RM | unchanged |
| average particle size (d 50) | preferably less than or equal to 50 µm, preferably 0.5-10 µm |
| residual moisture | preferably less than or equal to 0.4% by weight |

TABLE 3

MR2S-NT

| | |
|---|---|
| iron compounds | weight ratio of Fe (II) carbonate and the sum of iron hydroxide and iron oxide hydroxide to the oxides of iron at least 1 |
| aluminum compounds | weight ratio of the sum of aluminum hydroxide and aluminum oxide hydroxide to aluminum oxide preferably at least 1 |
| $Na_2O$ soluble | preferably less than or equal to 0.03% by weight |
| other constituents of the RM | unchanged |
| average particle size (d 50) | preferably less than or equal to 50 µm, preferably 0.5-10 µm |
| residual moisture | preferably less than or equal to 0.4% by weight |

Furthermore it is preferable if the surface of the modified red mud is provided with at least one substance which improves the compatibility of the particles of the modified red mud with a polymer matrix. In this way the incorporation of the modified red mud into the combustible material to be protected, which generally has a polymer matrix, can be simplified and the bonding of the components can be improved. Likewise in this way the characteristic profile of the polymer compound can be controlled in a targeted manner.

In this case it has proved advantageous if the substance is a surface modifying agent, selected from the group consisting of organosilanes, organotitanates, organo-zirconium aluminates, carboxylic acid derivatives, softeners, oligomer and polymer precursors, ionomers, boric acid and the metal salts and derivatives thereof, zinc stannates, zinc hydroxystannates or combinations thereof.

In a further preferred embodiment the flameproofing agent is present in combination with synergists, in particular organoclays (nanoclays), tin compounds and borates.

It is likewise preferable if the flameproofing agent also contains at least one further flame-retardant additive in a proportion up to 70% by weight, preferably 5 to 60% by weight, more preferably 10 to 50% by weight, more preferably 15 to 40% by weight.

A further particularly suitable flame-retardant additive is an endothermally reacting substance, preferably an endothermally reacting substance selected from the group consisting of aluminum hydroxide, boehmite, gibbsite, goethite, magnesium hydroxide, huntite, brucite or mixtures thereof.

The present disclosure further relates to the use of the flameproofing agent according to the disclosure as flame retardant for combustible materials, in particular combustible building materials, rubber, chipboard material, plastics, in particular cable sheathings, cable insulation compound or cable filling compounds.

Furthermore the present disclosure relates to a fireproofed material system, with examples comprising a combustible material and a flameproofing agent according to the disclosure.

The combustible material may in particular be a building material, a rubber product, a chipboard, a facade cladding or a plastic product, in particular a cable sheathing, cable insulation compound or a cable filling compound.

The fireproofed material system contains the flameproofing agent preferably in a proportion of 3 to 95% by weight, more preferably 5 to 90% by weight, more preferably 10 to 80% by weight, more preferably 20 to 75% by weight, more preferably 25 to 70% by weight, in particular 30 to 60% by weight.

In a modification the flameproofing agent used in the fireproofed material system preferably comprises the modified red mud according to the invention in a proportion of 30 to 100% by weight, more preferably 40 to 95% by weight, more preferably 50 to 90% by weight, more preferably 60 to 85% by weight, and the respective remaining proportion of 0 to 70% by weight, preferably 5 to 60% by weight, more preferably 10 to 50% by weight, more preferably 15 to 40% by weight, is formed by a further flame-retardant composition. In this case it is advantageous if the further flame-retardant composition comprises an organic, non-toxic, endothermally reacting substance such as APP, MC, MIC, etc. and/or a synergist. In this case it is likewise advantageous if the further flame-retardant composition comprises salt hydrates, hydroxides, oxide hydroxides and carbonates, oxycarbonates as well as hydroxycarbonates.

The present disclosure further relates to a method for producing a fireproofed material system, with examples comprising the steps of:
a) providing a combustible material,
b) coating or blending the combustible material with the flameproofing agent according to the invention, and thereby
c) obtaining the fireproofed material system.

In this case it is advantageous if before the coating or blending in step b) the flameproofing agent is physically treated, in particular ground or disagglomerated, preferably together with synergists, in particular organoclays (nanoclays), tin compounds and borates, and/or at least one further flame-retardant additive.

The flameproofing agent referred to in step b) is preferably subjected to a surface modification. This takes place preferably before the coating or blending with the combustible material.

The surface modification of the flameproofing agent preferably comprises providing the surface of the flameproofing agent with a surface modifying agent which is selected from the group consisting of organosilanes, organotitanates, organo-zirconium aluminates, carboxylic acid derivatives, softeners, oligomer and polymer precursors, ionomers, boric acid and the metal salts and derivatives thereof, zinc stannates, zinc hydroxystannates or combinations thereof.

It is likewise advantageous if, in particular when the flameproofing agent according to the disclosure is used in elastomeric, thermoplastic and thermosetting systems, synergists in the form of so-called "master batches" (active substance concentrates) in liquid, paste or granulate form are added during the processing.

Examples of the method according to the disclosure for producing the inorganic, halogen-free flameproofing agent produced from modified, recarbonized red mud (MKRS-HT) comprises the steps of:
a) providing red mud,
b) reducing the iron (III) compounds contained in the red mud in acidic solution to iron (II) compounds,
c) adding a carbonate compound to the solution containing iron (II) compounds obtained in step b), wherein iron (II) carbonate (siderite) is formed.

Preferred reducing agents which can be used in step b) are sulfur-containing reducing agents, in particular ($Na_2S_2O_4$) and sulfur dioxide ($SO_2$).

The reduction of the iron (III) compounds contained in the red mud to iron (II) compounds according to step b) preferably takes place in weak acidic solution, for example at a pH value of 4 to 6, in particular a pH value of 4.5 to 5.5.

Preferred carbonate compounds which can be used in step c) are alkali carbonates, alkali hydrogen carbonates and alkaline earth carbonates, in particular sodium carbonate ($Na_2CO_3$), sodium hydrogen carbonate ($NaHCO_3$) and calcium carbonate ($CaCO_3$). As is clear to the person skilled in the art on the basis of his specialist knowledge, the pH value of the solution containing acidic iron (II) compounds obtained in step b) must if appropriate be adjusted in a suitable manner before step c) in order to obtain iron (II) carbonate (siderite) by addition of a carbonate compound.

The inorganic, halogen-free flameproofing agent according to examples of the disclosure is produced from modified, recarbonized and rehydrated red mud may be produced, in that modified, recarbonized red mud (MKRS-HT), such as is for example described above, and modified, rehydrated red mud (MR2S-NT), such as is described for example in WO 2012/126487 A1, the disclosure of which is hereby incorporated in its entirety, are produced separately from one another and then mixed together to obtaining the modified, recarbonized and rehydrated red mud.

However, by suitable conduct of the reaction it is also possible for both a rehydration and also a recarbonization to proceed in the red mud to obtain the modified, recarbonized and rehydrated red mud. In order to guide the modification in a targeted manner in one or the other direction suitable technical measures can be adopted, such as for example conduct of the reaction under (oxidative) inert process gas, special drying followed directly by surface modification ("sealing") for a preferred modification in the direction of siderite. On the other hand, if predominantly goethite is to be produced, the reaction proceeds with atmospheric oxygen or alternatively ozone which oxidize the Fe (II) salt solutions to Fe (III) salt solutions. As the pH value rises goethite is produced which can likewise be dried and sealed at the surface.

Furthermore the surface modification/sealing serves to guarantee an optimal bonding of the polymer molecules in the interphase to the OHFR flame retardant. In this way the compound characteristics are controlled in a targeted manner.

By a targeted process management under inert gas or with atmospheric oxygen, drying and surface modification it is possible to produce a recarbonized and rehydrated red mud tailored for the required use.

The so-called inert process gas/protective gas should be free from all oxidizing components, especially (atmospheric) oxygen. In particular a process gas is used which is composed of equal parts of nitrogen and argon (TIG welding quality is sufficient) and which is circulated.

The inorganic, halogen-free flameproofing agent according to the invention produced from modified, (re)carbonised and rehydrated RM, or modified, (re)carbonised RM may also be produced, in that RM is only rehydrated and iron (III) or iron (II) compounds are transformed in isolation to iron (II) carbonate are being and both compounds are then mixed in arbitrary form. The iron (II) carbonate produced in isolation can be treated physically and/or chemically, in order to achieve special application-specific effects. The end products can be produced in both ways so as to be chemically identical.

Examples, experiments and further embodiments are described below, which should not however lead to limitation of the present disclosure. On the contrary they serve for clarification of the teaching according to the disclosure and the advantages thereof.

Production of Modified Red Mud:

EXAMPLES

Example 1

4 g red mud with a $Fe_2O_3$ content of 40% (1.6 g $Fe_2O_3$=0.01 mol) were admixed in the beaker with 60 ml of concentrated hydrochloric acid (0.6 mol) and stirred for 24 hours at room temperature.

After this time period a residue of 3.2 g could be separated off, i.e. 0.8 g $Fe_2O_3$ had dissolved (50%). With relatively long stirring and higher temperatures further $Fe_2O_3$ can be dissolved.

The pH value of the filtrate solution was set to 4.5 with dilute NaOH (0.5 mol NaOH in 100 ml water). Then 0.05 mol $Na_2SO_3 \times 7\ H_2O$ (1.3 g) in 50 ml $H_2O$ were added. After several hours the yellow solution was almost colorless. 1.2 g of precipitate was produced from this solution by addition of 0.8 g $Na_2CO_3$. According to PXRD this product consisted of 50% each of siderite and goethite. After a relatively long time period the precipitated product is initially colored greenish and then brown, i.e. the Fe (II) carbonate oxidised in the air to Fe (III) compounds. If on the other hand oxygen is excluded, siderite is predominantly precipitated which remains stable in the long term.

Thus it can be seen that under inert conditions siderite is precipitated, and under oxidative conditions goethite is precipitated at the end. Intermediate stages which contain siderite and goethite can be intercepted at any time and dried and can be sealed at the surface.

Example 2

The equipment used are preferably a correspondingly equipped spray tower (from NIRO Atomizer, Copenhagen). In this case the dried and optionally simultaneously surface-modified material is produced for example according to surface modification "A" (see below) on a microscale. If a nanoscale material is required for application-specific reasons, after the drying by means of a swirl fluidizer the surface coating can be carried out in the fluid mixer/fast mixer connected downstream.

Spray Tower:

The drying, the setting of the grain size distribution curve (Top-cut; d90, d50 and d10) and optionally the surface modification of the material preferably take place in the spray tower.

In the case illustrated here, i.e. with surface modification "A", the slurry which is to be introduced with a solids content, which can vary within wide limits, of for example 50%, has added to it the appropriate quantity of aminopropyl triethoxysilane (1% by weight AMEO from Evonik/Degussa based on the solids content; see section "surface modifications") with intensive stirring. The organosilane reacts by hydrolysis to an oligo-organosilanol, which is absorbed on the surface of the material to be dried and is fixed there, forming covalent bonds (see Edwin S. Plueddeman, Silane Technology, Elsevier, N.Y., USA).

Additionally 0.3% by weight (based on the solids content) of DISPEX A 80 is added to the slurry as dispersing and fluidifying agent, which makes the slurries pumpable in the first place.

The secondary particle size (i.e. the required degree of agglomeration) is set by the variation of the inlet temperature (typically between 500° C. and 300° C.) and the outlet temperature (typically between 120° C. and 60° C.) of the process gas, the spray disc rotation speed, the number and geometry of the nozzle orifices, the throughput per hour of slurry, within limits even above the slurry concentration (solids content).

If the spray tower is used without the aminosilane surface modification, MR2S-NT or MKRS-HT is produced on a microscale with optimized goethite or siderite content (depending upon the desired optimization according to the process management described above).

Optionally "disagglomeration" is carried out in a pinned disc mill (Fa. Alpine) connected downstream, i.e. the average particle size is set to a bandwidth of 1 until 1.5 µm (d50).

The grain size distribution curve corresponds approximately to that of a finely divided precipitated aluminum hydroxide, such as for example MARTINAL OL 104 (Martinswerk/Albemarle) or SUPERFINE SF4ESD (Alcan Ltd.), or that of a synthetic magnesium hydroxide, such as for example MAGNIFIN H5 (Magnesit Prod. Gesellschaft).

This grain size distribution curve enables a virtually optimal compounding into most thermoplastic and thermosetting polymer systems as well as rubber systems. The same ap0pies to all thermoplastic elastomer (TPE) systems.

Swirl Fluidizer:

The drying and the adjustment of a nanoscale product preferably takes place in the swirl fluidizer.

The optional surface modification is carried out exclusively in the fluid mixer (fast mixer) connected downstream.

In this case a plurality of surface modifying agents of solid, liquid or pasty consistency can be used. An in situ polymerization on the surface of the OHFR system, such as MR2S-NT or MKRS-HT, is possible.

In the swirl fluidizer under the same process gas conditions as in the spray tower the material according to the disclosure is transported by means of a frequency-controlled monoscrew into the reaction chamber. The correspondingly configured tool splits the material to be dried in the process gas, nanoscale primary particles being predominantly produced.

The process is controlled in a targeted manner, so that the product is produced on a nanoscale, by the throughput per hour, the inlet and outlet temperature of the process gas, and the residual moisture content of the material according to the invention selected as control variable as well as the configuration and the speed of rotation of the tool.

If a surface modification is to be carried out, the dry material (residual moisture content usually 0.05%) is metered into the fluid mixer connected downstream by means of a rotary valve and is coated there according to the description of "surface modification A, B, C and D".

In this case the outlet temperature of the optimized MR2S-NT or MKRS-HT, (typically 80° C.), which cools in the fluid mixer to approximately 50° C. equilibrium, is used to configure the surface modification process more effectively, since the material mixture quickly heats up to the respective reaction temperature.

The cooling mixer cools the product to room temperature, so that the product can be bagged immediately without intermediate silo storage.

DTA and TG Analyses

FIG. 1 shows DTA and TG curves of red mud (comparative example). Between 220° C. and 350° C. endothermic reactions can be seen, which are attributable to residues of gibbsite/boehmite and goethite. In the red mud the decomposition intervals of hydroxides/oxide hydroxides of aluminum and of iron are shifted into somewhat higher temperature ranges.

Figure 2:
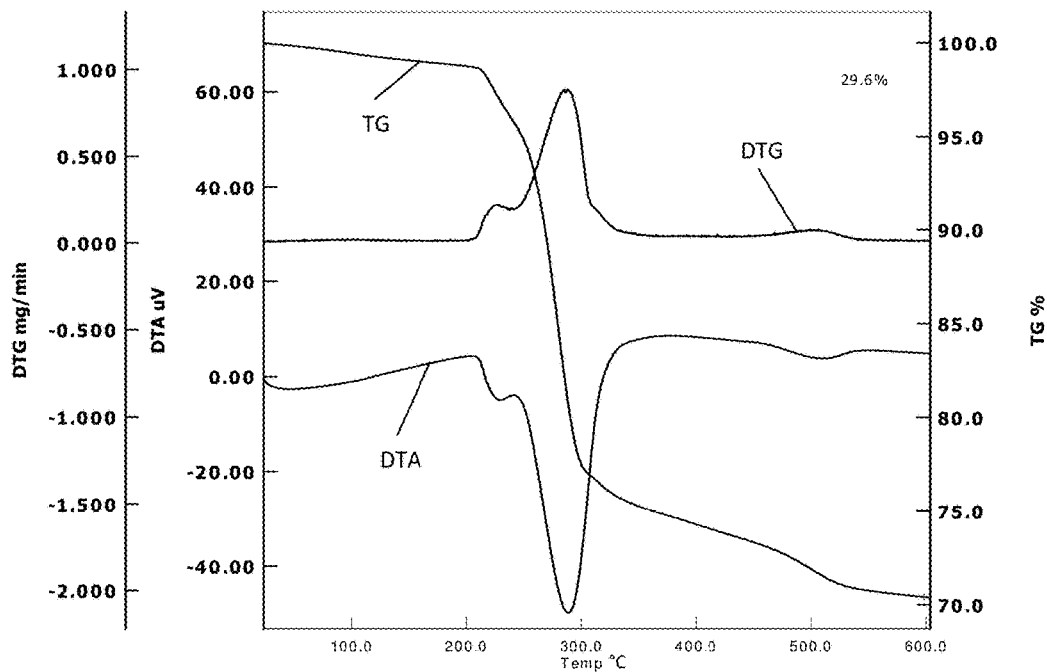
FIG. 2 shows differential thermoanalysis and thermogravimetg curves of an example red mud which has been rehydrated in the direction of gibbsite.

FIG. 2 shows DTA and TG curves of red mud which has been rehydrated in the direction of gibbsite (reference example). In this case goethite is also additionally produced. The endothermic reaction takes place between 210° C. and 350° C.

Figure 3:
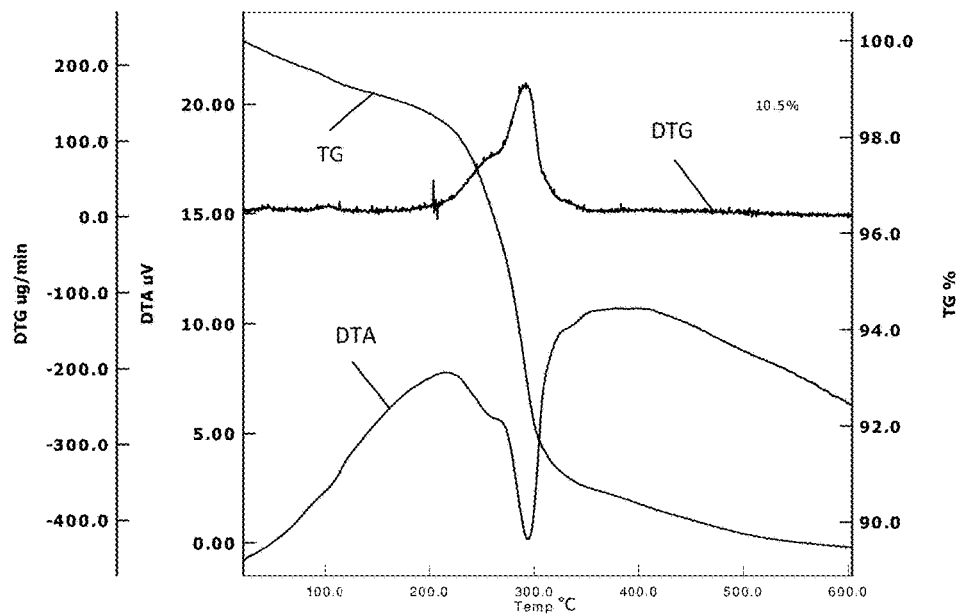
FIG. 3 shows differential thermoanalysis and thermogravimetgy curves of an example red mud which has been rehydrated in the direction of goethite.

FIG. 3 shows DTA and TG curves of red mud which has been rehydrated in the direction of goethite (reference example). In this case gibbsite is also additionally produced. The endothermic reaction takes place between 210° C. and 350° C.

Figure 4:
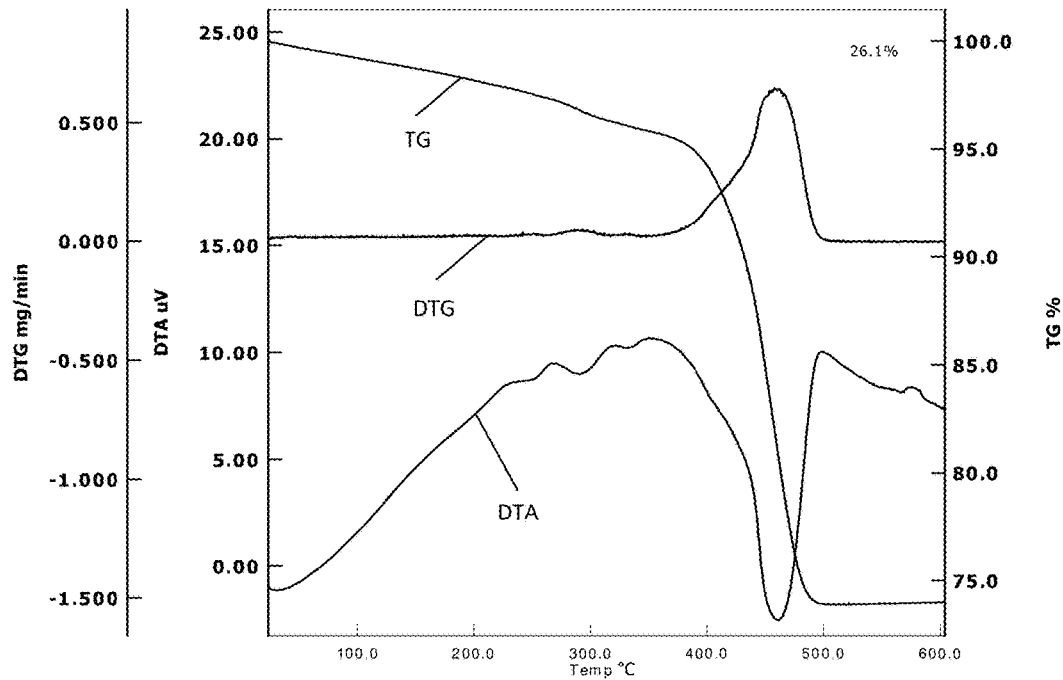
FIG. 4 shows differential thermoanalysis and thermogravimetg curves of an example red mud which has been recarbonized in the direction of siderite to provide a modified, recarbonized red mud (MKRS-HT)).

FIG. 4 shows DTA and TG curves of red mud which has been recarbonized in the direction of siderite (example according to the disclosure: modified, recarbonized red mud (MKRS-HT)). The endothermic reaction takes place between 350° C. and 500° C., that is to say in the high-temperature range.

Figure 5:
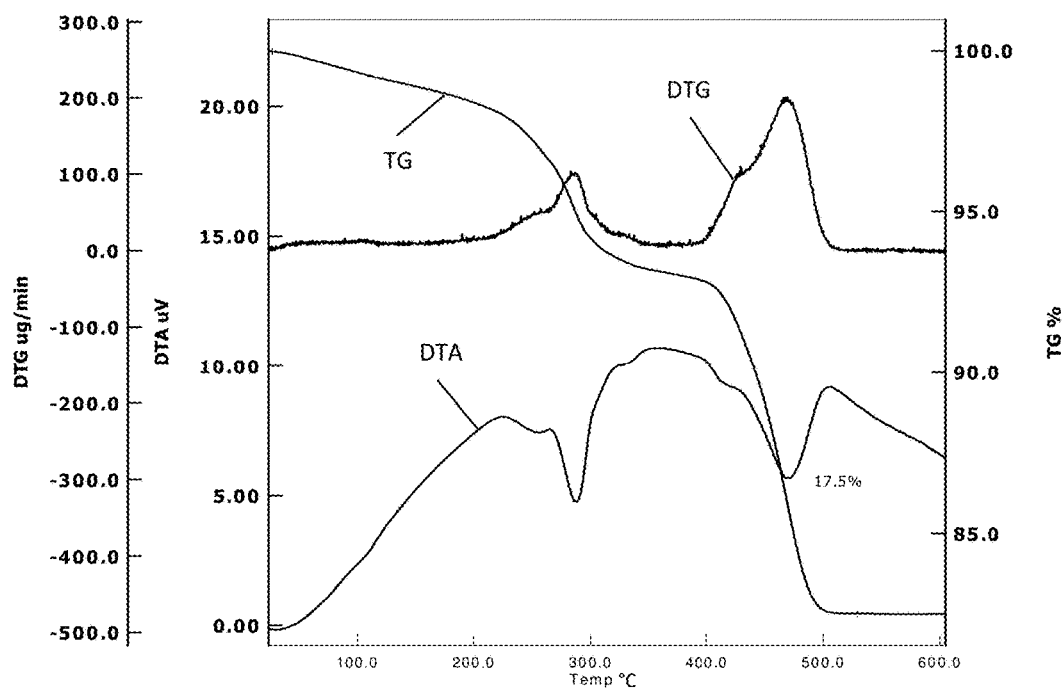
FIG. 5 shows differential thermoanalysis and thermogravimetg curves of an example red mud which has been rehydrated in the direction of goethite and also recarbonized in the direction of siderite to provide a modified, recarbonized and rehydrated red mud (MKRS-HT/MR2S-NT)).

FIG. 5 shows DTA and TG curves of red mud which has been rehydrated in the direction of goethite and also recarbonized in the direction of siderite (example according to the disclosure: modified, recarbonized and rehydrated red mud (MKRS-HT/MR2S-NT)). The endothermic reaction for the hydroxides/oxide hydroxides goethite/gibbsite takes place between 220° C. and 350° C. in the low-temperature range (LT) and for siderite between approximately 350° C.-500° C. in the high-temperature range (HT). Thus products of this type show endothermic reactions from approximately 220° C. to 500° C.

Figure 6:
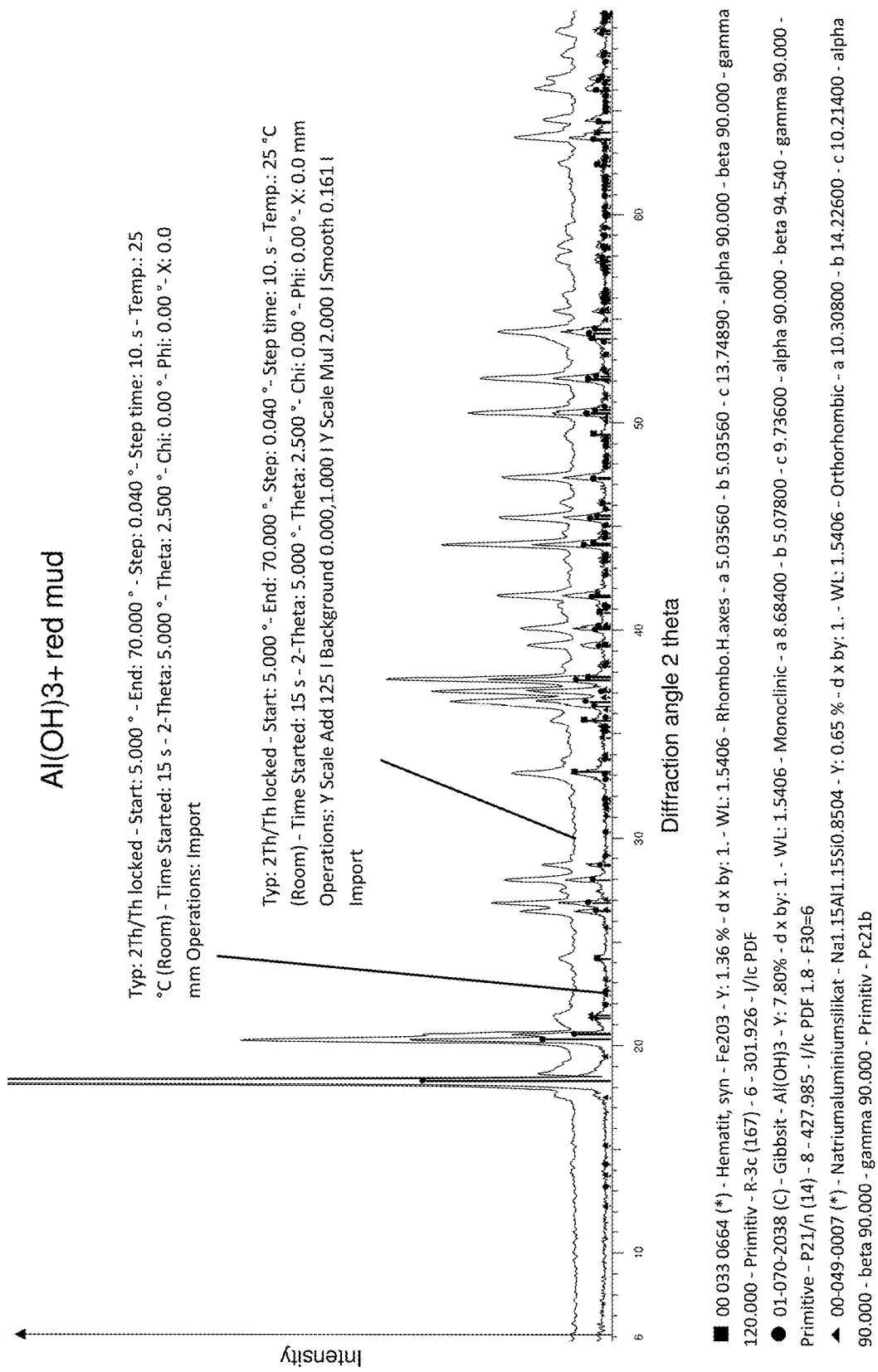
FIG. 6 shows a radiographic diagram of an example red mud which has been rehydrated in the direction of gibbsite.

Radiographic Analyses:

FIG. 6 (diagram 1) shows the radiographic diagram of red mud which has been rehydrated in the direction of gibbsite (cf. DTA and TG curves FIG. 2). The line diagrams show:

Line Diagram A:

Type: 2Th/Th locked-Start: 5.000°-end: 70.000°-Step: 0.040°-Step time: 10. s-Temp.: 25° C. (Room)-Time Started: 15 s-2-Theta: 5.000°-Theta: 2.500°-Chi: 0.00°-Phi: 0.00° X: 0.0 mm Operations: Import Line Diagram B:

Type: 2Th/Th locked-Start: 5.000°-end: 70.000°-Step: 0.040°-Step time: 10. s-Temp.: 25° C. (Room)-Time Started: 15 s-2-Theta: 5.000°-Theta: 2.500°-Chi: 0.00°-Phi: 0.00°-X: 0.0 mm Operations: Y Scale Add 125 I Background 0.000, 1.000 I Y Scale Mul 2.000 I Smooth 0.161 I Import Legend:

■ 00 033 0664 (*)-Hematite, syn-$Fe_2O_3$-Y: 1.36%-d x by: 1.-WL: 1.5406-Rhombo.H.axes-a 5.03560-b 5.03560-c 13.74890-alpha 90,000-beta 90,000-gamma 120,000-primitive-R-3c (167)-6-301,926-I/Ic PDF ● 01-070-2038 (C)-gibbsite-$Al(OH)_3$-Y: 7.80%-d x by: 1.-WL: 1.5406-Monoclinic-a 8.68400-b 5.07800-c 9.73600-alpha 90.000-beta 94.540-gamma 90.000-primitive-P21/n (14)-8-427.985-I/Ic PDF 1.8-F30=6

Figure 7:
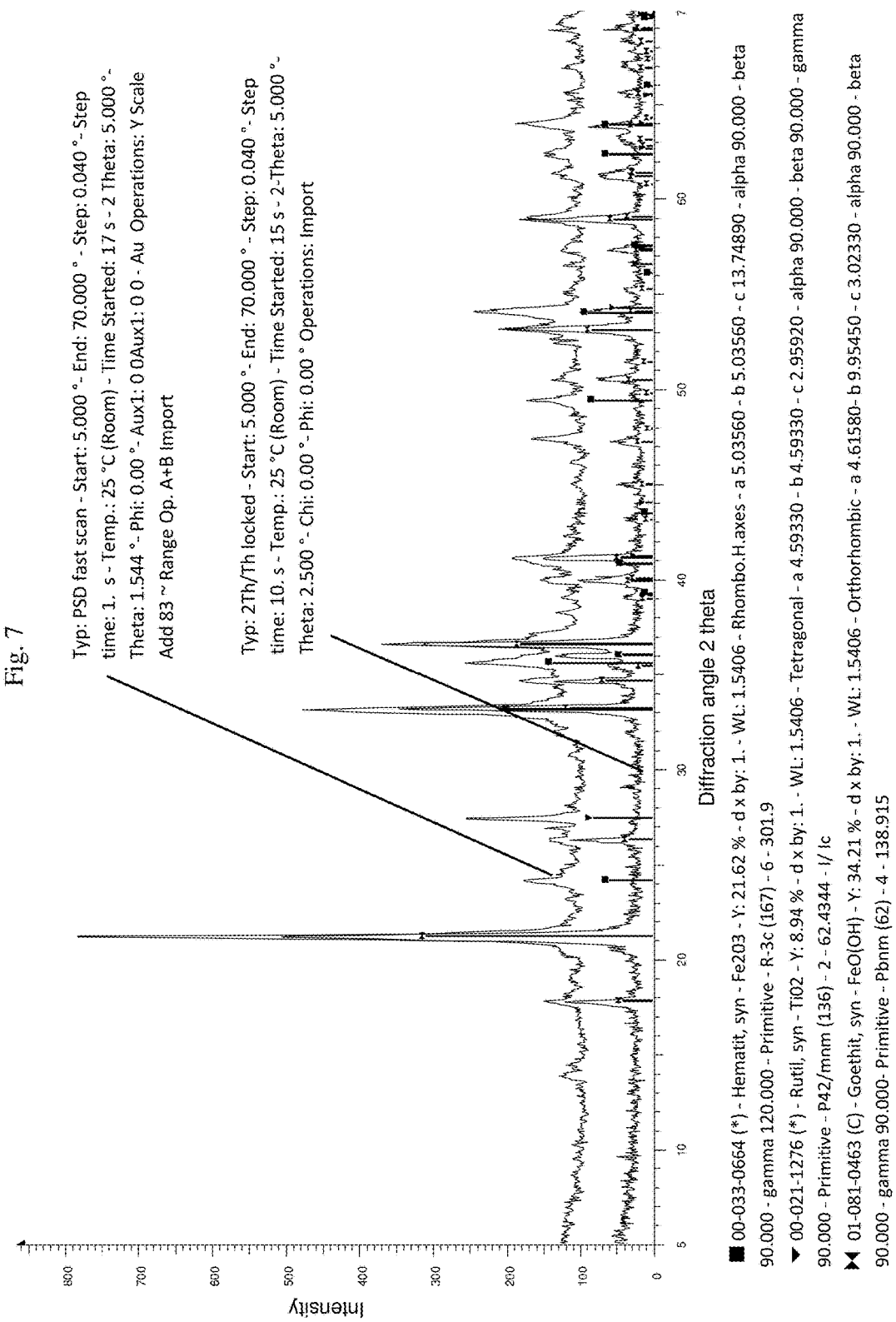
FIG. 7 shows a radiographic diagram of an example red mud which has been rehydrated in the direction of goethite.

■ 00-049-0007 (*)-sodium aluminum silicate-Na1.15A11.15Si0.8504-Y: 0.65%-d x by: 1.-WL: 1.5406-Orthorhombic-a 10.30800-b 14.22600-c 10.21400-alpha 90.000-beta 90.000-gamma 90.000-primitive-Pc21b FIG. 7 (diagram 2) shows the radiographic diagram of red mud which has been rehydrated in the direction of goethite (cf. DTA and TG curves FIG. 3). The line diagrams show:

Line Diagram A:

Type: PSD fast scan-Start: 5.000°-end: 70.000°-Step: 0.040°-Step time: 1. s-Temp.: 25° C. (Room)-Time Started: 17 s-2-Theta: 5.000°-Theta: 1.544°-Phi: 0.00°-Aux1: 0 0Aux1: 0 0-Au Operations: Y Scale Add 83-Range Op. A+B Import Line Diagram B:

Type: 2Th/Th locked-Start: 5.000°-end: 70.000°-Step: 0.040°-Step time: 10. s-Temp.: 25° C. (Room)-Time Started: 15 s-2-Theta: 5.000°-Theta: 2.500°-Chi: 0.00°-Phi: 0.00° Operations: Import Legend:

■ 00-033-0664 (*)-Hematite, syn-$Fe_2O_3$-Y: 21.62%-d x by: 1.-WL: 1.5406-Rhombo.H.axes-a 5.03560-b 5.03560-c 13.74890-alpha 90.000-beta 90.000-gamma 120.000-primitive-R-3c (167)-6-301.9

▼ 00-021-1276 (*)-rutile, syn-$TiO_2$-Y: 8.94%-d x by: 1.-WL: 1.5406-Tetragonal-a 4.59330-b 4.59330-c 2.95920-alpha 90.000-beta 90.000-gamma 90.000-primitive-P42/mnm (136)-2-62.4344-I/Ic ▶◀ 01-081-0463 (C)-goethite, syn-$FeO(OH)$-Y: 34.21%-dx by: 1.-WL: 1.5406-Orthorhombic-a 4.61580-b 9.95450-c 3.02330-alpha 90.000-beta 90.000-gamma 90.000-primitive-Pbnm (62)-4-138.915

Figure 8:
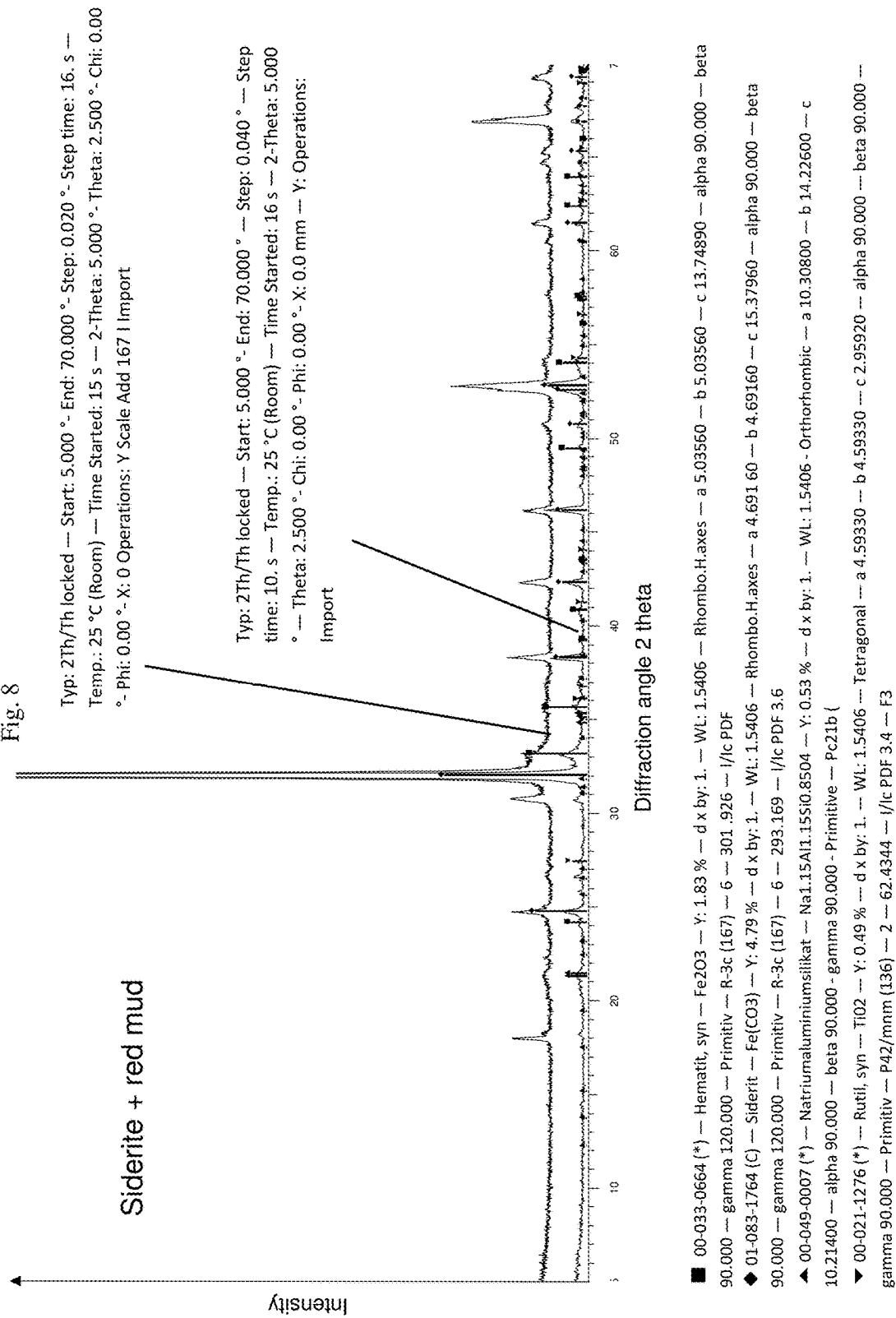
FIG. 8 shows a radiographic diagram of an example red mud which has been recarbonized in the direction of siderite.

FIG. 8 (diagram 3) shows the radiographic diagram of red mud which has been recarbonized in the direction of siderite (cf. DTA and TG curves FIG. 4). The line diagrams show:

Line Diagram A:

Type: 2Th/Th locked-Start: 5.000°-end: 70.000°-Step: 0.020°-Step time: 16. s-Temp.: 25° C. (Room)-Time Started: 15 s-2-Theta: 5.000°-Theta: 2.500°-Chi: 0.00°-Phi: 0.00°-X: 0 Operations: Y Scale Add 167 I Import Line Diagram B:

Type: 2Th/Th locked-Start: 5.000°-end: 70.000°-Step: 0.040°-Step time: 10.s Temp.: 25° C. (Room)-Time Started: 16 s-2-Theta: 5.000°-Theta: 2.500°-Chi: 0.00°-Phi: 0.00°-X: 0.0 mm-Y: Operations: Import Legend:

■ 00-033-0664 (*)-Hematite, syn-$Fe_2O_3$-Y: 1.83%-dx by: 1.-WL: 1.5406-Rhombo.H.axes-a 5.03560-b 5.03560-c 13.74890-alpha 90.000-beta 90.000-gamma 120.000-primitive-R-3c (167)-6-301.926-I/Ic PDF ◆ 01-083-1764 (C)-siderite-$Fe(CO_3)$-Y: 4.79%-d x by: 1.-WL: 1.5406-Rhombo.H.axes-a 4.691 60-b 4.69160-c 15.37960-alpha 90.000-beta 90.000 gamma 120.000-primitive-R-3c (167)-6-293.169-I/Ic PDF 3.6

▲ 00-049-0007 (*)-sodium aluminum silicate-Na1.15A11.15Si0.8504-Y: 0.53%-d x by: 1.-WL: 1.5406-Orthorhombic-a 10.30800-b 14.22600-c 10.21400-alpha 90.000-beta 90.000-gamma 90.000-primitive-Pc21b ( ▼ 00-021-1276 (*)-rutile, syn-$TiO_2$-Y: 0.49%-d x by: 1.-WL: 1.5406-Tetragonal-a 4.59330-b 4.59330-c 2.95920-alpha 90.000-beta 90.000-gamma 90.000-primitive-P42/mnm (136)-2-62.4344-I/Ic PDF 3.4-F3

Figure 9:
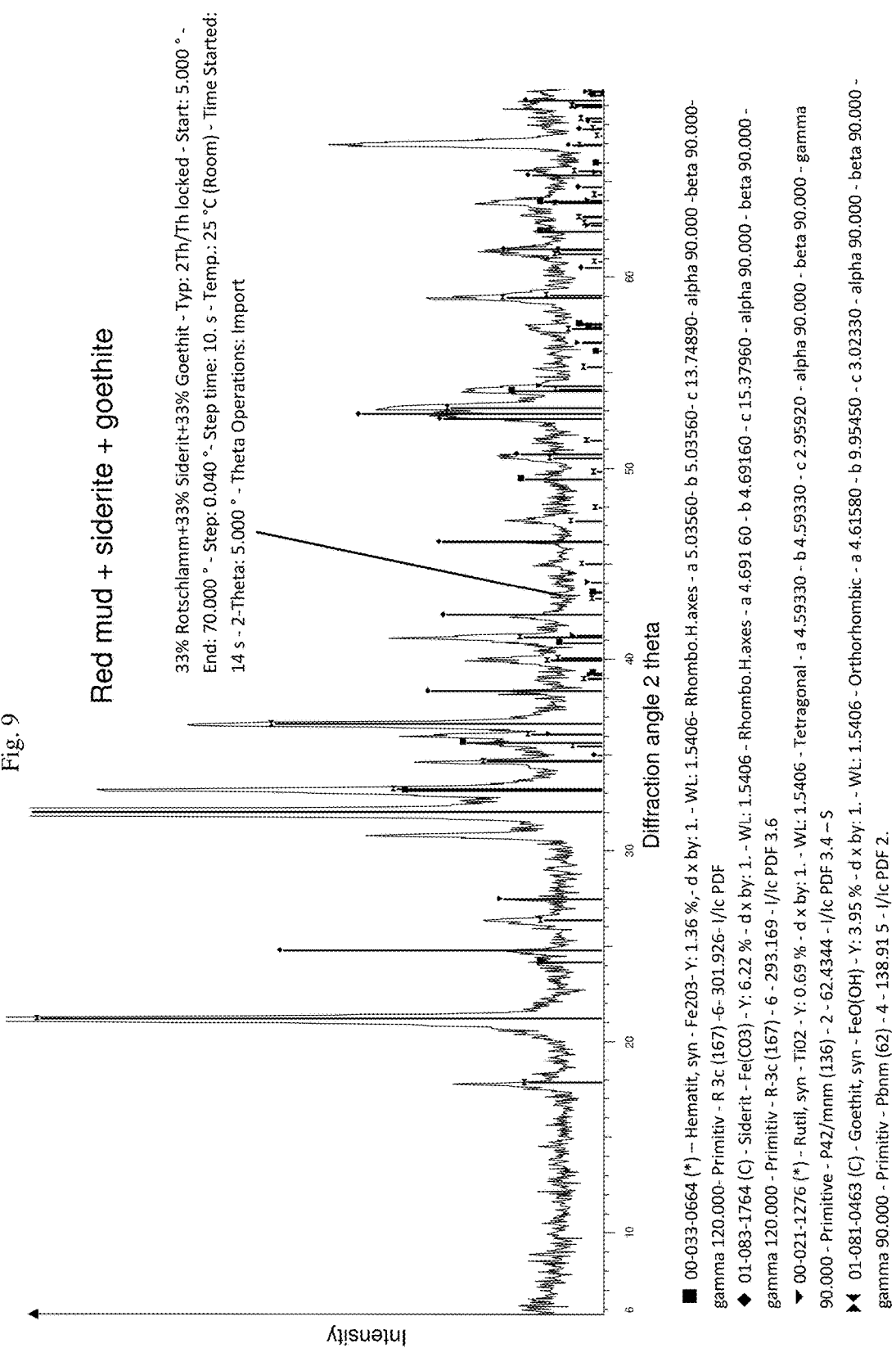
FIG. 9 shows a radiographic diagram of an example red mud which has been both recarbonized in the direction of siderite and rehydrated in the direction of goethite.

FIG. 9 (diagram 4) shows the radiographic diagram of red mud which has been both recarbonized in the direction of siderite and rehydrated in the direction of goethite (cf. DTA and TG curves FIG. 5). The line diagram shows:

Line Diagram:

33% red mud+33% siderite+33% goethite-type: 2Th/Th locked-Start: 5.000°-end: 70.000°-Step: 0.040°-Step time: 10. s-Temp.: 25° C. (Room)-Time Started: 14 s-2Theta: 5.000°-Theta Operations: Import Legend:
■ 00-033-0664 (*)-Hematite, syn-$Fe_2O_3$-Y: 1.36%-d x by: 1.-WL: 1.5406-Rhombo.H.axes-a 5.03560-b 5.03560-c 13.74890-alpha 90.000-beta 90.000-gamma 120.000-primitive-R 3c (167)-6-301.926-I/Ic PDF
♦ 01-083-1764 (C)-siderite-$Fe(CO_3)$-Y: 6.22%-d x by: 1.-WL: 1.5406-Rhombo.H.axes-a 4.691 60-b 4.69160-c 15.37960-alpha 90.000-beta 90.000-gamma 120.000-primitive-R-3c (167)-6-293.169-I/Ic PDF 3.6
▼ 00-021-1276 (*)-rutile, syn-$TiO_2$-Y: 0.69%-d x by: 1.-WL: 1.5406-Tetragonal-a 4.59330-b 4.59330-c 2.95920-alpha 90.000-beta 90.000-gamma 90.000-primitive-P42/mnm (136)-2-62.4344-I/Ic PDF 3.4-S
▶◀ 01-081-0463 (C)-goethite, syn-$FeO(OH)$-Y: 3.95%-dx by: 1.-WL: 1.5406-Orthorhombic-a 4.61580-b 9.95450-c 3.02330-alpha 90.000-beta 90.000-gamma 90.000-primitive-Pbnm (62)-4-138.91 5-I/Ic PDF 2.

Discussion

The standard method for qualitative and quantitative determination of the phase composition of samples in powder form is X-ray powder diffractometry. This is a versatile, non-destructive method which can also supply detailed information about the atomic structure and the crystal structure both from naturally occurring and also synthetically produced materials.

In this case each crystalline material when illuminated with X-ray radiation exhibits a unique and characteristic diffraction pattern which is defined by size, symmetry and atomic structure and can be used for unambiguous identification.

The expression "thermal analysis" covers methods which measure chemical and/or physical characteristics of a compound as a function of the temperature. In this case the change in mass of a sample is measured in the thermogravimetry (TG) as a function of the temperature and/or of the time. A thermobalance integrated into the measuring instrument serves for this purpose. On the other hand the differential thermoanalysis (DTA) uses the characteristic thermal energy turnover at a phase transition for quantitative and qualitative analysis. In this case the temperature of the sample is compared with that of a reference substance.

The radiographic diagram and the DTA and TG curves demonstrate that red mud can be both rehydrated and also recarbonized. In all cases red mud has been used which is produced at the tube digester (270° C./60 bar).

In the recarbonization siderite is predominantly produced, and in the rehydration predominantly gibbsite/boehmite and especially goethite is produced.

In the production of these products red mud was reduced in the first step in an acidic solution. In the second step siderite was precipitated out of this solution undergoing oxidatively inert conditions by the addition of $NaHCO_3$, $Na_2CO_3$ or $CaCO_3$. If optimization in the direction of gibbsite or goethite is required, goethite and gibbsite are precipitated by increase of the pH value under oxidizing conditions.

Thus overall and according to the disclosure, OHFR systems which exhibit their endothermic flame-retardant effect in the range from 210° C. to 310° C., or 350° C. to 500° C. can be produced from red mud by rehydration or recarbonization.

Thus by arrangement of the recarbonization and rehydration one after the other or by mixing of recarbonized and rehydrated red mud, tailored OHFR products for all types of plastic systems are produced both in the low-temperature range and also in the high-temperature range.

From the figures it can be seen how modified rehydrated or modified recarbonized red mud, which has been modified predominantly either in the direction of gibbsite/boehmite and goethite/lepidocrocite/akaganeite or predominantly in the direction of siderite, is thermally decomposed and the temperature ranges in which this occurs.

In this case the respective oxides and water are produced from the hydroxides or the oxide hydroxides of aluminum and of iron, and the corresponding oxide and $CO_2$ is produced from iron (II) carbonate. The $CO_2$ produced acts additionally as a fire-extinguishing agent.

In particular siderite decomposes in a temperature range in which the hydroxides and oxide hydroxides have already decomposed and thus can no longer make an effective contribution to the flameproofing.

The significantly higher decomposition temperature of siderite is advantageous in so far as, under testing according to UL 94 vertical, after the complete dehydration of the hydroxides and oxide hydroxides the burning process can occur again. Thus with MKRS-HT optimized for a high siderite content, a suitable OHFR flame retardant is available for higher temperature ranges.

Overall the possibility is offered of developing a FR system in which by skillful combination of low-temperature OHFR agents, such as ATH or goethite, lepidocrocite, akaganeite, and high-temperature OHFR agents, such as preferably iron (II) carbonate, the necessary flameproofing, or respectively the spread of fire which is inherent in the system can be controlled so that the optimal OHFR effect is achieved for each polymer system or respectively FR compound system.

Thus according to the invention "tailored" OHFR materials can be synthesised in a targeted and highly specific manner with modified rehydrated red mud (MR2S-NT) and/or recarbonized red mud (MKRS-HT). It is also possible to produce such products for flameproofing by mixing red muds modified in the direction of MR2S-NT or in the direction of MKRS-HT.

The effect can also be intensified by the described surface modification and combination with the described synergists, in particular nanoclays.

In principle it may be established that the processing temperature of the material systems to be flameproofed determines which products the modified red mud should contain. In the field of high-temperature flame protection, products for low-temperature flame protection such as ATH, goethite, lepidocrocite and akaganeite are unsuitable, since sich these products already decompose during processing. Red muds which are rehydrated and/or recarbonized in a specific and targeted manner according to the invention and which satisfy the required conditions can be produced by a correspondingly controlling of the rehydration process or recarbonization process. Conversely in low-temperature flame protection the products of high-temperature flame protection are not disruptive in principle, since the decomposition temperature of these materials is far higher than the polymer processing temperature. In contrast it is advantageous, since the decomposition of the siderite-optimized MKRS-HT substantially increases the flameproofing potential.

Surface Modification:

Surface modifications have a substantial influence on the quality of the FR systems and on the workability thereof during the compounding. Furthermore selected surface modifications support the FR effect and the bonding in the interphase (compatibilization effect).

The following recipes are used for example for a surface modification:

1) Surface Modification A:
1% by weight of n-aminopropyl triethoxysilane (AMEO) from Degussa/Evonik, based on the total mass of the non-polymer components 2) Surface Modification B:
1% by weight EDENOR C 12/98-100 (Henkel, Germany), 1.5% by weight SFR 100 (General Electric Silicones, Schenectady, N.Y., USA), based on the total mass of the non-polymer components 3) Surface Modification C:
2% by weight Trilene 66 (Uniroyal) (liquid EP(D)M polymer),
1% by weight Unichema 4900 (Stearic acid) Unichema,
1% by weight Levapren 600 (EVA-copolymer),
based on the total mass of the non-polymer components 4) Surface Modification D:
1% by weight Lithsolvent PL (Fa. Keller & Bohacek, Duisseldorf, Germany),
2% by weight Epikote Resin 1163,
1% by weight EDENOR C 14 (Henkel),
based on the total mass of the non-polymer components A fluid mixer or also a turbine mixer which has a multi-level variable tool and of which the outer casing can be temperature-controlled is used for the surface modification.

The reaction additives are metered into the mixing/reaction chamber either at the start of the mixing cycle with the material to be modified in the stationary or in the slowly starting turbomixer. If the modification additives are intended to be liquid to pasty, they are metered into the funnel of the mixer.

After the ending of the reaction the hot material is cooled gently to room temperature or bagging temperature (typically 35° C. to 23° C.) in the cooling mixer connected downstream. This material is characterized by powder technology and is then used in polymer compounds described below.

Examples of the OHFR materials according to the disclosure which are described are durable for any period of time and in the described modifications have no chemically discernible expiry date, presupposing appropriate dry storage in preferably closed original packaging. Due to the particle size distribution, the permanent risk of partial or total separation, due for example to transport processes or at the discharge from the silo or the weigher on the compounding unit, does not exist as in the case of the FR compositions blended from individual components with different average particle size values (d50). The previously described OHFR materials according to examples of the disclosure can be used in the respective compounding as they are, i.e. for example without predrying. Specially the surface-modified variants of the OHFR materials according to examples of the disclosure take no moisture out of the ambient air and thus can be used unchanged/without predrying.

Method for Processing the Materials According to the Disclosure to Produce the OHFR Compounds Referred to in the Example:

Test Materials Used:
Polymers
  EVA copolymer "ESCORENE ULTRA UL 00119" from ExxonMobil
  PP random copolymer "VESTOLENE PP 8400"
  polyamide 6 "ULTRAMID B3L" from BASF
  PVC DS 7060 from ICI UK Flame Retardant
  aluminum hydroxide "SUPERFINE SF4 ESD" from Alcan Chemicals Ltd. Burntisland, Scotland, UK (zero sample)
  magnesium hydroxide "Magnifin H 5" von Veitscher Magnesit Produktionsgesellschaft, Breitenau, Austria (zero sample)
  pentabromodiphenylether p.a. and antimony trioxide p.a. (zero sample)
  MR2S-NT (zero samples)
  MKRS-HT (sample according to the disclosure)
  MR2S-NT/MKRS-HT (sample according to the disclosure)

Additives/Synergists
  Nanoclay: "Bentone 104" from Elementis Inc., USA or "Nanofil SE 3000" from Südchemie/Rockwood Clay Additives GmbH, Germany
  zinc stannate "FLAMTARD S" from Joseph Storey, UK Compounding Units All quoted polymer compounds were, as indicated in the respective tables, processed on the following compounding units to produce the corresponding molding compounds:

1) BUSS coaxial kneader (MDK 46 E, 15 L/D with GS 70 3.5 D) with an average throughput of 15 to 20 kg/h
2) co-rotating twin-shaft(-screw) extruder (DSE or SSE) Werner & Pfleiderer ZSK 25 with an average throughput capacity from 12 to 25 kg/h or Leistritz GL 50 mm with 44 L/D with an average throughput capacity from 60 to 250 kg/h.

Metering Equipment

Gravimetric weighers (loss-in-weight feeder) on all feed stations for polymers, additives/stabilizers and OHFR agents both in the main intake (ELS 1 in the BUSS co-kneader) and also "downstream" wherein the polymer granulate weigher functions as master weigher.

In the split-feed mode the OHFR agents are in each case metered into the polymer stream distributed over the three metering stations.

The compounds present in the form of granulate are then processed both by means of injection molding and also by means of extrusion to produce the corresponding test objects according to DIN/ISO and ASTM and are then tested. The test objects for testing of the specific contact resistance are produced from a rolled sheet blank by melting of the granulate on a temperature-controlled laboratory double roller in a heated/coolable panel press. Before the respective tests the finished test objects are equilibrated in the standard room climate.

Tests

Tensile strength [MPa] DIN EN ISO 527 (referred to here as TS)

Tensile modulus of elasticity [MPa] DIN EN ISO 527 (referred to here as E-Mod)

Elongation at break [m/m] DIN EN ISO 527 (referred to here as EL)

Tear resistance [MPa] DIN EN ISO 527 (referred to here as TR)

Impact strength [kg/m$^2$] DIN EN ISO 8256 (referred to here as a(n))

Oxygen index [%] DIN EN ISO 4589-2 (referred to here as LOI)

Charpy impact strength [kg/m$^2$] DIN EN ISO 179 (referred to here as a(k))

UL 94 Vertical according to IEC/DIN 60695-10/-11/-20 and CSA C 22.2
Cone calorimeter according to ISO 5660-1/ASTM E 1354
Specific contact resistance DIN ISO 53482 [Ω×cm] (referred to here as SCR)
MFI (Melt Flow Index) at X° (C.) and
Load weight y (kg) in (g/10 minutes)

Here in the case of EVA/PE normally 190° C. at 5 kg or at 10 kg for poorly flowing polymers. In the case of PP normally at 230° C. and 2.16 kg or 5 kg loading for the poorly flowing extrusion types In Table 4 the minimum requirements which are for example usual in Europe for cable compounds/cable sheaths.

TABLE 4

| Rating of the conductor temperature | 90° C. |
| --- | --- |
| Tensile strength | >10 MPa |
| Elongation at break | >1.5 m/m (=150%) |
| Water consumption | max. 5% (24 h at 100° C.) |

Generally all variants of the OHFR material according to the invention can be produced on all processing machines/compounding units which are used in the (plastics) industry for the production of (highly) filled polymer compounds, such as for example (Banbury) internal mixer; double roll mills; internal mixer; Farrel continuous mixer (FCM); planet shaft extruder; SSE (single screw extruder) with screws which enable an effective homogenization (Maddox mixer head, locking rings); intensive mixer.

As a result of the high bulk density (UTBD) both the low-temperature variant and also the high-temperature variant of the modified RM and the extremely good pourability the materials can be added into the compounding machine extremely well both with conventional volumetric metering equipment and also
(preferably) with gravimetric metering equipment (so-called "loss-in-weight feeder" for example from K-Tron-Soder or Brabender).

Examples

Examples for EVA:
0) Basic Formulation as Zero Sample
Formulation.
EVA 00119 40%
ATH 60%
Results:
TS: 8.9
TR: 6.5
EL: 1.8
SCR: E 13
MFI (190/10): 1.6
UL 94 V(3.2 mm): V-0
LOI: 28
Comment:
This formulation corresponds to the accepted standard within the cable industry and is the basis for comparison for the examples in the polymer system PE/EVA.
1)
Formulation:
EVA 40%
MKRS-HT 60%
Results:
TS: 9.8
EL: 1.6
SCR: E 14/E 12
UL 94 V (3.2 mm): (V-2)*
LOI: 26
MFI (190/10): 1.4
*: the afterglow is too long, consequently the classification according to UL 94 vertical: n.m. (not met)
Comment:
In this formulation the modified recarbonized RM (MKRS-HT) is used exclusively. The mechanical values correspond to the standard. The afterglow can be suppressed by the addition of corresponding synergists—such as for example zinc stannate, borates, etc. 2)
Formulation:
EVA 40%
MKRS-HT 60%; surface-modified with coating "D"
Results:
TS: 14.4
EL: 1.5
SCR: E15 E 14
UL 94 V (3.2 mm): V-1
LOI: 29
MFI (190/10): 2.3
Comment:
In this formulation modified recarbonized RM (MKRS-HT) with the surface modification according to formulation "D" is used exclusively. The mechanical values are very good by comparison with the standard, the electrical values are likewise very good, the workability is significantly improved (by a factor of 2). The flameproofing is likewise improved. The compound can be used for very many W & C applications.
3)
Formulation:
EVA 35%
MR2S-NT 30%
MKRS-HT 30%
Nanoclay 5%
The mixture of MRRS and nanoclay is provided with the surface modification "A".
Results:
TS: 16.6
EL: 3.41
E-Mod: 189
SCR: E 15/E 15
UL 94 V (3.2 mm): V-0
LOI: 28
Comment:
In this formulation a targeted mixture of modified rehydrated RM (MR2S-NT) and modified recarbonized RM (MKRS-HT), that is to say a modified, recarbonized and rehydrated red mud, with the surface modification "A" is used. The mechanical and electrical values are very good. An outstanding value for the specific contact resistance is shown. The flame resistance corresponds to that of a comparable ATH flameproof compound.
4)
Formulation:
EVA 40%
MKRS-HT 26%
MDH 26%
Nanoclay 5%
Flamtard S 3%
All non-polymer components are provided with the surface modification "C".
Results:
TS: 15
EL: 1.75

SCR: E 15/E 14
UL 94V(1.6 mm): V-0
LOI: 49
Comment:
In this formulation modified recarbonized RM (MKRS-HT) is used in a targeted combination with a conventional OHFR filler (here: MDH) in combination with synergists (nanoclay, zinc stannate). The mechanical, electrical and FR characteristics are outstanding by comparison with the aforementioned standard.

5)
Formulation:
EVA 55%
MKRS-HT nanoscale 18.5%
MDH 18.5%
Nanoclay 5%
Flamtard S 3%
The non-polymer components are provided with the surface modification "B".
Results:
TS: 19.6
EL: 2.9
SCR: E 15/E15
UL 94 V (1.6 mm): V-0 LOI: 41
Comment:
In this formulation, by comparison with formulation 4), a reduced amount of flame retardant (combination of MKRS-HT on a nanoscale with MDH and synergists (nanoclay and Flamtard S)) with the surface modification according to formulation "B" is used. Nevertheless results are achieved which are comparable with those of formulation 4).

Examples for PVC:
0) Basic Formulation as Zero Sample
Formulation:
PVC DS 7060 24.7%
Plasticiser DIOP 12.3%
ATH Superfine SF4 ESD 61.7%
Irgastab EZ 712 1.3%
Results:
Time to Ignite (sec) 34
PHRR (KW/m$^2$) 118
THR (MJ/m$^2$) 50.8
Specific Extinct. Area (m$^2$/kg) 116.5
Fire Performance Index (m$^2$ s/KW) 0.3
Smoke parameter (MW/kg) 18.7
Comment:
This formulation is the reference standard for PVC formulations.

1)
Formulation:
PVC DS 7060 24.7%
Plasticiser DIOP 12.3%
MKRS-HT 61.7%
Irgastab EZ 712 1.3%
Results:
Time to Ignite (sec) 69
PHRR (KW/m$^2$) 106
THR (MJ/m$^2$) 23.1
Specific Extinct. Area (m$^2$/kg) 122.0
Fire Performance Index (m$^2$ s/KW) 0.7
Smoke parameter (MW/kg) 14

Comment:
In this formulation modified recarbonized RM (MKRS-HT) is used. The flameproofing values are improved by comparison with the ATH based standard.

Examples for PP:
0) Basic Formulation as Zero Sample
Formulation:
PP 8400 35%
MDH 65%
Results:
TS: 24.3
TR: 10.8
EL: 0.021
E-Mod: [3400]:
a(n): 5.8
UL 94 V (3.2 mm): V-0
MFI (230/5): 4.6
Comment:
This formulation is the reference standard based on MDH which is accepted in the plastics industry.

1)
Formulation:
PP 8400 35%
MKRS-HT 65%
Results:
TS: 17.5
EL: 0.23
UL 94 V (3.2 mm): V-2
MFI (230/5): 1.5
Comment:
In this formulation modified recarbonized RM (MKRS-HT) is used exclusively. The elongation at break is improved by comparison with the zero sample, but the flameproofing does not reach the level of the values specified there.

2)
Formulation:
PP 8400 35%
MKRS-HT 60%
Nano 5%
The non-polymer components are provided with the surface modification "D".
Results:
TS: 19.1
EL: 0.56
a(n): 5.8
UL 94 V (3.2 mm): V-0
MFI (230/5): 6.1
Comment:
In this formulation, in addition to modified recarbonized red mud (MKRS-HT) nanoclay is also used as synergist and a surface coating according to formulation "D" is used. The mechanical values and the flame resistance values correspond to the standard. The workability is considerably improved.

Examples for Polypropylene with Organic Bromine Flameproofing
0) Basic Formulation as Zero Sample
Formulation:
PP 8400 63%
Pentabromodiphenyl ether 12%
Antimony trioxide 5%
Mica 20%
Results:
TS: 23.6
EL: 0.023
a(n): 15.5

UL 94 V (1.6 mm): V-2
MFI (230/5): 7
Comment:
   This constitutes a polyolefin FR formulation which serves as comparison sample to the following formulation.
1)
Formulation:
PP 8400 63%
Pentabromodiphenyl ether 6%
Antimony trioxide 2%
MKRS-HT 29%
Results:
TS: 25.8
EL: 0.17
a(n) without breakage (w. br.)
UL 94 V (1.6 mm): V-0
MFI (230/5): 6
Interpretation:
   With a halving of the load on organic halogen/antimony trioxide flameproofing system (in percent), the use of the MKRS-HT according to the invention in place of mica results in a compound which achieves a V-0 in the fire test according to UL 94 vertical. In this connection the mechanical values are considerably better than those of the zero sample.
Examples for Polyamide:
0) Basic Formulation as Zero Sample
Formulation:
PA B3L 45%
MDH (H-7) 55%
Results:
E-Mod: 5000
TS (TR): 58 (58)
EL: 0.023
a(n): 21
UL 94 (3.2 mm): V-0
Comment:
   The PA B3L is an impact strength-modified model for a widely used "Engineering Plastic" PA, which is used inter alia in FR applications such as FI protective circuits. This formulation is regarded in the corresponding plastics industry as a flameproof polyamide reference standard.
1)
Formulation:
PA B3L 45%
MKRS-HT 55%
Results:
TS: 55
TR: 55
EL: 0.018
E-Mod: 4520
a(n): 19
UL 94 V (3.2 mm): V-2
Comment:
   In this formulation modified recarbonized RM (MKRS-HT) is used. The mechanical values correspond, the flame resistance value is poorer than the standard.
1)
Formulation:
PA B3L 45%
MKRS-HT 55%, provided with the surface modification A
Results:
TS (TR): 65 (65)
EL: 0.09
E-Mod: 5600
a(n): 32
UL 94V (3.2 mm): V-1; (1.6 mm): n.e.

Comment:
   In this formulation in addition to modified recarbonized RM (MKRS-HT) "A" is used. The surface modification A especially improves the flame resistance of the compound quite considerably, although it still does not reach the level of the standard, but is already considerably better than that in formulation 1). In addition the mechanical characteristics also improve considerably, which is helpful for technically demanding applications.
3)
Formulation:
PA B3L 45%
MKRS-HT 50%
Nanoclay 5%
   The non-polymer components are provided with the surface modification "D".
Results:
TS: 63
TR: 63
EL: 0.29
E-Mod: 5500
a(n): 34
UL 94 V (3.2 mm): V-0 1.6 mm): V-1
Comment:
   In this formulation, in addition to modified recarbonized red mud (MKRS-HT) synergist nanoclay and the surface modification according to formulation "D" is used. This compound formulation supplies an outstanding flame resistance, which allows a reduction in the wall thickness of the electrical components. In this case the mechanical values reach the industry standard.
Discussion
   Outstanding inorganic, halogen-free flameproofing agents can be obtained by rehydration and according to examples of the disclosure by recarbonization from red mud which is produced as a waste product when ATH is obtained from bauxite according to the Bayer process.
   Without chemical treatment red mud also shows a certain flame-retardant effect, which is attributable to residues from gibbsite/boehmite or goethite and other synergistic effects in the red mud, but overall fluctuate to a greater or lesser extent, that is to say are undefined. Flame retardants with defined characteristics are produced only by rehydration and especially by recarbonization of RM.
   The content of hydroxides/oxide hydroxides of the aluminum and iron is increased by rehydration. These products exhibit their flame-retardant action between approximately 220° C. and 350° C. Fe (II) carbonate which develops its flame-retardant effect between approximately 350° C. and 500° C. by decomposition in iron oxide and $CO_2$ is produced especially by recarbonization from red mud.
   Thus flame retardants can be produced which either act in the temperature range between 350° C. to 500° C., that is to say they constitute high-temperature flame retardants, or they act in the temperature range between 220° C. and 350° C., that is to say they constitute low-temperature range flame retardants or by special conduct of the reaction or by mixing they cover both the low-temperature and also the high-temperature range and thus are active between 220° C. and 500° C.
   Together with the substances otherwise still present in the red mud, such as silicates, aluminum silicates, $TiO_2$, etc. which likewise act specifically or synergistically, novel, cost-effective OHFR products are thus available which are tailored for each polymer. The products previously available on the market are ATH and MDH, which act between 180° C. and approximately 350° C. ATH covers the range from 180° C. to approximately 220° C., MDH as so-called "high-temperature flame retardant" covers the range up to 350° C. The products obtained from red mud by rehydration or according to examples of the disclosure by recarbonization cover with one single product temperature ranges between 220° C. and 350° C., 350° C. and 500° C. or 220° C. and 500° C.

The products produced from red mud can be subjected to both physical and also chemical changes. Physical changes are understood to be in particular the adjustment of the average particle size and the residual moisture content. The chemical changes include the adjustment of the proportion of "$Na_2O$-soluble" (water-soluble sodium compounds) as well as surface coatings with substances such as for example organosilanes, organotitanates, organozirconium aluminates, carboxylic acids, hydroxycarboxylic acid derivatives, softeners, oligomers, polymer precursors, polymers, ionomers, boric acid and the metal salt derivatives thereof, zinc stannates, zinc hydroxystannates or combinations thereof. Furthermore these products can be combined with synergists such as for example organoclays (nanoclays), tin compounds, boric acid, fluoropolymers (less than 5%) etc.

In the examples tests were carried out with the following polymers: EVA, PP, polyamide 6 and PVC. Tests were conducted by comparison with ATH, MDH and pentabromophenylether/antimony trioxide as zero samples. MKRS-HT or MR2S-NT/MKRS-H were used as products according to the disclosure.

The following results could be achieved:

EVA

The formulations referred to in the examples resulted in compounds which produced very good mechanical values, outstanding values for the specific contact resistance and flameproofing values comparable to those of compounds provided with ATH. The compounds can be used in all W & C applications.

PVC

The formulation given in example 1) is improved in terms of its flameproofing values by comparison with the ATH-based standard.

PP

The formulation given in example 2) corresponds in its mechanical values and the flameproofing values to the standard.

In the case of PP provided with organic bromine flameproofing, in formulation 1) by comparison with the zero sample the quantity of pentabromodiphenyl ether/antimony oxide was halved and mica was omitted. For this purpose MKRS-HT was integrated. This formulation showed better mechanical characteristics and achieved the fire protection UL 94 vertical (VO).

PA

The formulation given in example 3) achieves mechanical values corresponding to the standard. The flame resistance is outstanding.

Thus overall it may be established that modified, recarbonized red mud (MKRS-HT) or modified, rehydrated red mud (MR2S-NT) or mixtures of both for example by special process management or by mixing of MR2S-NT and MKRS-HT produce OHFR systems which correspond to a product of the technology previously covered by ATH and MDH. According to examples of the disclosure, with MKRS-HT an additional product is introduced into the market which is very suitable for the high-temperature range (350° C.-500° C.). Additionally the red mud matrix, into which the products MR2S-NT and/or MKRS-HT produced by modification are embedded, appears to shift the reaction intervals, in which hydroxides/oxide hydroxides of aluminum and iron act, into higher temperature ranges.

The surface modification of the siderite-optimized MKRS-HT variant is produced by excellent behavior in the water storage, i.e. practically no decrease in the specific contact resistance is observed. This is an extraordinary result for a mineral flameproofing agent.

Generally it may be established that with modified, recarbonized and/or rehydrated red mud, i.e. with MKRS-HT or MR2S-NT or MKRS-HT/MR2S-NT OHFR systems tailored for each polymer can be found which are significantly more economical by comparison with products used in the past, but in this case comparable results can be achieved with regard to mechanical values and above all flameproofing. These OHFR systems can also be mixed with the products on the market, for example with ATH, MDH, brucite or huntite etc., in order to achieve or to emphasize special effects.

Barite Substitute

Furthermore, according to examples the disclosure it may be established that red mud, modified, rehydrated and recarbonized red mud and mixtures thereof can be substituted for barite in specific applications. Products equipped in this way then also exhibit a flame-retardant effect in addition to the "effect comparable to barite". Thus there is a dual effect. Examples of such applications are for example fenders.

Sound Insulation

Furthermore, according to the disclosure it may be established that red mud, modified, rehydrated and recarbonized red mud and mixtures thereof have a sound-insulating effect. Thus products which are equipped therewith also exhibit a sound-insulating effect in addition to the flame-retardant effect. Thus here too there is a dual effect. Examples of such applications are for in particular plastics systems which are used in the construction industry.

Red mud, modified, rehydrated and recarbonized red mud and mixtures thereof can also be added to mineral material systems for the purpose of sound insulation. Example in this case are gypsum plasterboards, screeds, concrete, etc. Important applications are in particular in the construction industry.

In the previous and the following statements the use of the expression "can" or "can be" should be understood as synonymous with "preferably" or "preferably has" and should explain further embodiments according to the disclosure.

Embodiments according to the invention may have one or more of the aforementioned and/or following features.

Antimony Trioxide Substitute, Heat Insulation, Heat Storage, Shielding of Electromagnetic Waves Some or all of the embodiments according to the disclosure may have one, several or all of the advantages referred to above or below.

The preferred advantageous fields of application of the flameproofing agent according to the disclosure MKRS-HT and/or MR2S-NT are, in addition to the halogen-free flameproofing effect already previously described:

the partial or preferably complete substitution of the antimony trioxide both in PVC-formulations and also in organic halogen flameproof formulations;

the heat insulation: In particular where, in addition to the heat insulation in its diverse possible configurations, the flameproofing of the respective component also plays a part;

the heat storage: In particular where, in addition to the heat storage in all its possible technical configurations, the heat insulation and the flameproofing of the corresponding components plays a part;

the soundproofing: In particular where, in addition to the soundproofing, characteristics such as heat storage and/or heat insulation and in particular an extended and/or fundamental flameproofing play a part; and/or the shielding of electromagnetic radiation: In particular where, in addition to a flameproofing effect, heat storage and/or heat insulation and/or electromagnetic radiation, resulting for example from various sources with different energy and somewhat disastrous effects on the integrity of electrical and/or electronic components and/or complete systems, as well as the effects of so-called "electro-smog" on residents and/or sensitive people, are to be minimized.

These fields of application are significant in particular where for example in the field of building or equipment construction, in addition to the described effects, an efficient halogen-free flameproofing is also concerned.

In this connection in principle said typical effects can be combined with one another as required and according to technical necessity in order to achieve the required characteristic profile.

As already stated, considered in general, there are three main approaches in order to achieve a certain flameproofing in polymer systems:

intumescent ER systems (for example melamine derivatives+polymer; etc);

halogen-free FR systems (in particular: ATH, MDH, APP, etc); and/or halogen-containing FR systems (for example PVC+antimony trioxide; organic halogen ER+$Sb_2O_3$+polymer; etc).

The flameproofing agent MKRS-HT and/or MR2S-NT according to examples of the disclosure, as described above for the halogen-free FR systems, are optimally suitable for the halogen-containing FR systems.

Therefore the present disclosure further relates to the use of a flameproofing agent according to the disclosure or the use of mixtures of a flameproofing agent according to the disclosure with red mud as filler, in particular in plastics systems, preferably instead of barite. Thus it may advantageously be possible to give compounded synthetic materials simultaneously a flame-retardant characteristic.

Furthermore the disclosure relates to the use of the flameproofing agent according to the disclosure as a substitute or surrogate for antimony trioxide ($Sb_2O_3$).

In advantageous embodiments according to the disclosure the flameproofing agent according to the disclosure can be used alternatively at least partially or completely as a substitute or surrogate for antimony trioxide ($Sb_2O_3$).

In particular in PVC wire and cable compounds, as also in organic halogen flameproof compounds (Hal-FR compounds), antimony trioxide is usually employed as synergist.

In the event of fire, in the PVC compound the antimony trioxide reacts with the halogen intermediate released in the pyrolysis to produce antimony oxychloride (SbOCl) or antimony oxybromide (SbOBr), which are both active as radical catchers in the gas phase and thus interrupt the burning process.

In this case the aforementioned effective compounds are for the most part responsible for the high flue gas density. Since in the event of fire the flue gas density leads to affected persons being unable to use escape routes successfully and thus may be injured, it is advantageous if the flue gas density is minimized. However, in this case especially the fire inhibition in the entire system must not be impaired.

However, the antimony trioxide usually employed has several disadvantages. These disadvantages are, in addition to the aforementioned points, both the toxicity, which is based on carcinogenic, teratogenic and/or mutagenic effects, and also the price, which ensures a tense supply situation.

The compounds, such as zinc molybdate, calcium molybdate or antimony pentoxide, which are suitable as possible substitutes have other disadvantages. For example they have an even higher price compared with antimony trioxide. Moreover they generate considerable stability problems in many compound formulations.

Here the use of the flameproofing agent according to the invention (MKRS-HT and/or MR2S-NT) on place of the antimony trioxide offers an advantageous alternative. In particular the flameproofing agent according to examples of the disclosure is technically just as effective and above all not toxic. Moreover the use according to the disclosure of the flameproofing agent according to examples of the disclosure is also advantageous from the market perspective, in particular with regard to the availability and/or the price.

Since the flameproofing agent (MKRS-HT and/or MR2S-NT) according to examples of the disclosure has a particle size distribution spectrum comparable with the commercially available antimony trioxide, it can advantageously be prepared just like this. In particular the flameproofing agent according to examples of the disclosure can be advantageously incorporated into the compound as master batch, as powder or as paste. In this way it may advantageously be possible to avoid costly additional steps in the compounding.

Furthermore the disclosure relates to the use of the flameproofing agent according to the disclosure as a synergist.

In advantageous embodiments according to the disclosure the synergist may in particular be capable of trapping or binding halogen-containing intermediate products produced in the event of a fire.

Furthermore the disclosure relates to the use of the flameproofing agent according to the disclosure as a thermal stabilizer. Thus it may advantageously be possible for the thermal stability of material systems which contain the flameproofing agent according to the invention to be increased in a targeted manner or generally to be controlled.

In advantageous embodiments according to the disclosure the flameproofing agent according to the disclosure may in particular be provided and/or suitable as thermal stabilizer in compositions containing polyvinyl chloride (PVC) or in compounds containing PVC and/or halogen-containing flameproof compositions.

In further advantageous embodiments according to the disclosure the flameproofing agent according to the disclosure may in particular be used in compositions containing polyvinyl chloride (PVC) or in compounds containing PVC and/or halogen-containing flameproof compositions as a filler and/or as a substitute or surrogate for antimony trioxide ($Sb_2O_3$) and/or as a synergist and/or as thermal stabilizer.

In other advantageous embodiments according to the disclosure the PVC-containing compositions may in particular be PVC-containing cables or PVC-containing cable compounds.

Furthermore, in specific advantageous embodiments according to the disclosure the PVC-containing compositions additionally contain a softener.

Examples

The respective compounds are produced by means of a Buss co-kneader (MDK/E 46-11 D/GS 46 (3.5 D)) and the corresponding granules are processed to produce test objects by means of a laboratory mill and a double-plate press which can be heated or cooled. Before the respective test the test objects are equilibrated in a standard climate (23° C., 50% relative humidity) for 48 hours. Tables 5 and 6 show several results.

TABLE 5

Flue gas density

| Flue gas suppressor | Control compound | $Sb_2O_3$ | MKRS-HT |
|---|---|---|---|
| NBS Smoke Chamber (ASTM E 662) Flaming Mode | | | |
| D 90 (average) | 56 | 31 | 20 |
| D 4.0 (average) | 224 | 144 | 110 |
| D max. (average) | 350 | 260 | 208 |
| Limiting Oxygen Index | 40 | 42 | 46 |

Formulation: PVC oxyvinyl—240 (100 phr), lead fumarate—9 phr, TOTM-35 phr, Cl.-PE—15 phr, epox. soyabean oil—3 phr, $Sb_2O_3$—2 phr, MgO—10 phr, $SF_4$ ESD (ATH) 29-phr, chalk (Ultracarb U5)—29 phr, respective flue gas suppressor—10 phr

TABLE 6

Dynamic stability in "lead-free" PVC-formulation

| Formulation component In phr | Control compound | Comp. Containing MKRS-hat |
|---|---|---|
| Oxyvinyl 240 (PVC) | 100 | 100 |
| $SF_4$ | 80 | 40 |
| Uniplex FRP-45 | 20 | 20 |
| Sanctiziser 2148 | 32 | 32 |
| Stearic acid | 1 | 1 |
| Bäropan MC 91108 KA | 8 | 8 |
| MKRS-HT | | 40 |
| Decomposition time | 38:10 | 47:54 |

Furthermore the disclosure relates to the use of the flameproofing agent according to the disclosure for heat storage or as a heat-storage material.

The heat storage capacity of construction materials is generally described by the heat storage coefficient S which is proportional to the specific heat C and to the apparent density p:

$$S = C*p \text{ (kJ/m}^3\cdot\text{K) or (Wh/m}^3\text{K)}.$$

This gives the amount of heat which is necessary is in order to heat 1 m³ of the building material by 1 Kelvin (=1° C.).

The heat storage capacity Q is determined by the component thickness s and the heat storage coefficient S:

$$Q = Cps \text{ (kJ/m}^2\text{K) or(Wh/m}^2\text{K)}.$$

Figure 10:
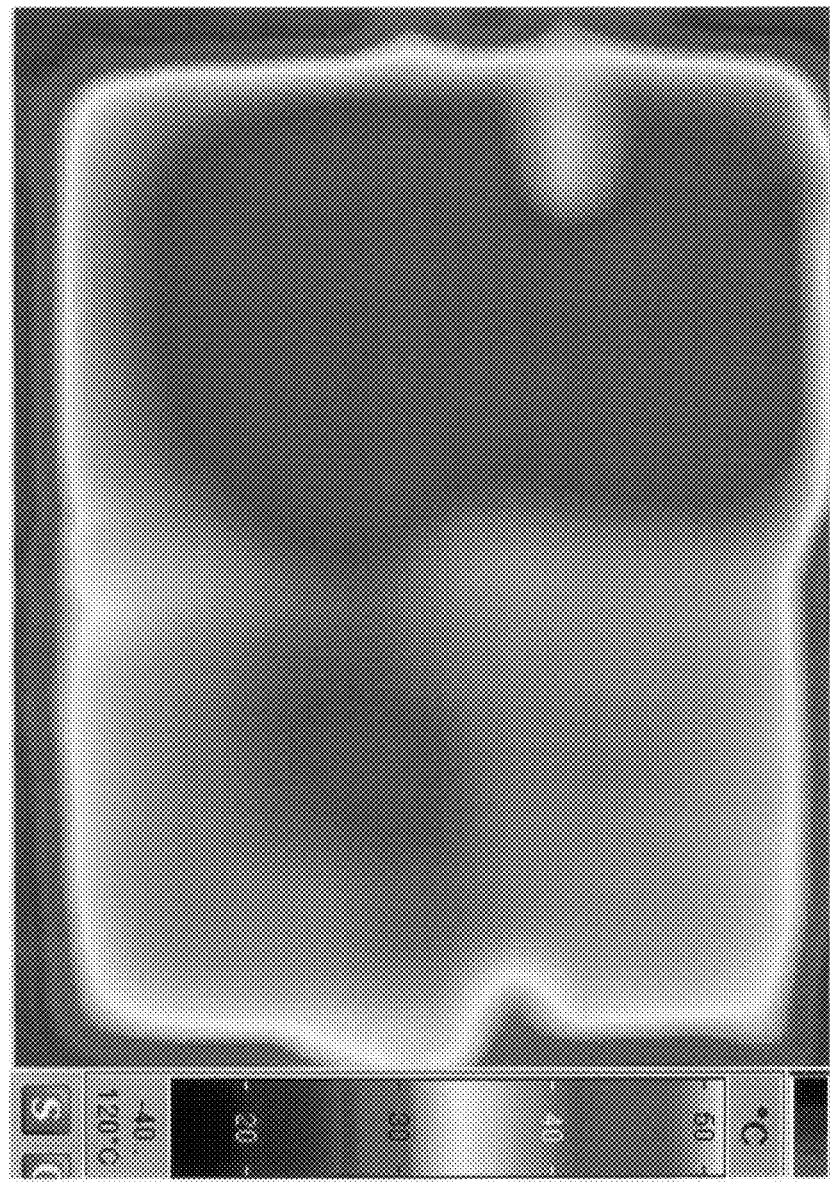
FIG. 10 shows an example thermal camera image of a panel during cooling.

Comparative studies between commercially available gypsum plasterboards and filled panels produced with the flameproofing agent (MKRS-HT and/or MR2S-NT) according to examples of the disclosure and based on a polymer matrix, shows surprisingly that the panels produced with the flameproofing agent (MKRS-HT and/or MR2S-NT) according to examples of the disclosure in the solid configuration at the same starting temperature cooled very much more slowly than the commercial gypsum plasterboards. FIG. 10 shows by way of example a thermal camera image of such a panel during cooling thereof.

Figure 11:
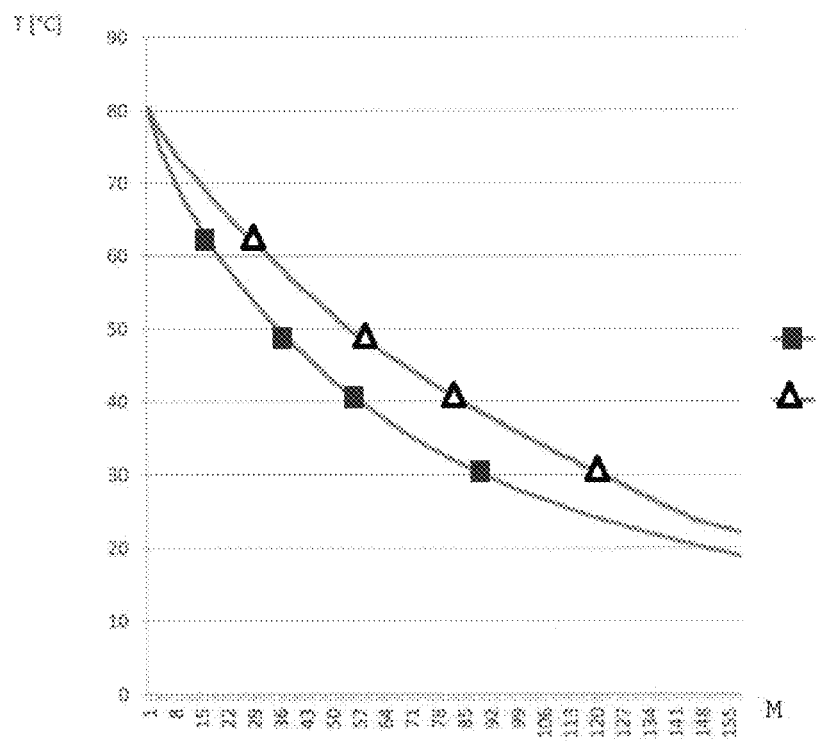
FIG. 11 shows example cooling curves of two measured test panels.

FIG. 11 shows by way of example the respective cooling curves of two measured test panels. One test panel is a gypsum board having a layer thickness of 10 mm (see the curve with the square symbols). The other test panel is a test panel produced with the flameproofing agents MKRS-HT and/or MR2S-NT according to examples of the disclosure, containing gypsum and 30% by weight of a flameproofing agent according to examples of the disclosure with a layer thickness of 10 mm (see the curve with the triangular symbols). In this case both panels were stored for 3 h in a drying cabinet at 80° C. Then they were locked in a vertical position and their heat radiation was measured and recorded with the aid of a thermal imaging camera. In this case 5 camera images per minute were recorded during 31 minutes. The horizontal axis therefore has 155 measurement points M. As can be seen clearly in FIG. 11, the panels produced with the flameproofing agent according to examples of the disclosure (MKRS-HT and/or MR2S-NT) cool more slowly than the commercial gypsum boards. A similar situation is observed between commercial gypsum plasterboards and those produced with the flameproofing agent (MKRS-HT and/or MR2S-NT) according to examples of the disclosure, even with different percentages by weight of the flameproofing agent according to the disclosure.

Figure 12:
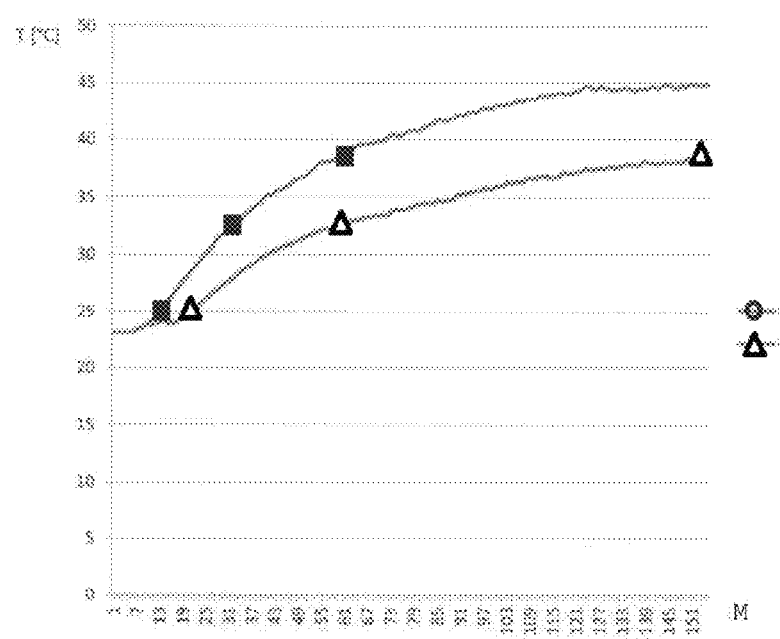
FIG. 12 shows example heating curves of two measured test panels.

FIG. 12 shows by way of example the respective heating curves of two measured test panels. One test panel is a commercial gypsum board (see the curve with the square symbols) and the other is a test panel produced with the flameproofing agents (MKRS-HT and/or MR2S-NT) according to examples the disclosure (see the curve with the triangular symbols), which has formed micropores during setting. For the investigation of the thermal insulation characteristics, two test panels were locked in a vertical position and hot air was blown onto the respective rear faces thereof by a hot air gun. Afterwards in each case the temperature on the rear face was 95° C. The temperature was recorded and determined with the aid of a thermal imaging camera on the front face of the respective panels. In this case a measurement interval of 5 images per minute was set. The horizontal axis therefore has 151 measurement points M. It is clear that the test panel produced with the flameproofing agent (MKRS-HT and/or MR2S-NT) according to examples of the disclosure has a stronger thermal insulation by comparison with the commercial gypsum board.

Due to the substance according to the disclosure, for the first time the advantageous technical possibility is provided of using this heat storage capacity in a polymer matrix, with a simultaneous guarantee of halogen-free flameproofing in the entire system. This offers considerable advantages especially in the field of composite production.

As soon as this system is incorporated in a polymer matrix for the purpose of easier production, in order to ensure the integrity of the entire composite flameproofing is necessary. This can be achieved advantageously and according to the disclosure by means of a flameproofing agent according to the disclosure (MKRS-HT and/or MR2S-NT).

In this case the use of polymer matrices advantageously enables a production of the heat storage composite system which is favorable in terms of energy, in particular in continuous manufacturing processes (for example in the case of extrusion with or without foaming).

Furthermore the disclosure relates to the use of the flameproofing agent according to examples the disclosure for thermal insulation or for heat absorption or as a thermal insulating or heat absorbing material.

The thermal conduction of a substance is determined by the coefficient of thermal conductivity λ (W/mK). This number indicates how much heat, measured in W/m$^2$, passes through a wall 1 meter thick at a temperature difference of 1 Kelvin (=1° C.).

The apparent density of a wall material is generally included in the coefficient of thermal conductivity in so far as the coefficient of thermal conductivity increases as the apparent density rises (=more compact material). Conversely, this means that the lightest material possible, preferably a vacuum-sealed system or a nanocellular foamed material, in the pores of which the free path length of the gas contained therein is minimal, has the lowest coefficient of thermal conductivity and thus the best thermal insulation performance.

In the case of organic materials for structural components as well as natural building materials, which can absorb or give off moisture, the moisture content plays a part in that as the moisture content increases in the building material the thermal insulation effect decreases.

Furthermore the disclosure relates to the use of the flameproofing agent according to examples of the disclosure for sound insulation or as sound proofing or as a sound-insulating material.

In order to reduce and/or to prevent the structure-borne sound, which means the transmission of sound from one structural part system to another, to some extent comprehensive design provisions must be implemented. Such provisions generally necessitate co-ordination of the entire system. An extremely important provision in this connection is for example the footfall sound insulation. This is generally achieved constructively so that the transmission of the footfall sound vibrations from the floor is reduced to the actual covering construction decoupling. For this purpose, between the floor and the covering greatly damping materials are disposed which have a high internal damping behavior, such as for example cork, rubber, rubber-bonded metal or rock wool.

The airborne sound insulation can generally be achieved by components or systems with a high specific weight. In some advantageous embodiments of the present invention the flameproofing agent according to the invention may be present in a building material and/or in equipment construction materials.

In other advantageous embodiments of the present disclosure the flameproofing agent according to the disclosure may be present in a matrix.

In further advantageous embodiments according to the disclosure the matrix may in particular be a thermoplastic or a thermosetting matrix, in particular a polymer matrix.

In specific advantageous embodiments according to the disclosure the flameproofing agent according to the disclosure may be present in a composite.

In some advantageous embodiments according to the disclosure the composite may contain a matrix and, optionally, auxiliary substances and/or additives.

In further advantageous embodiments according to the disclosure the composite may be solid and/or foamed. In particular such a composite may have a foamed core and/or a closed surface.

In some advantageous embodiments according to the disclosure the composite may in particular have a specific weight of 15 to 800 kg/m$^3$.

In further advantageous embodiments according to the disclosure the flameproofing agent according to the invention may be present in a foam.

In other advantageous embodiments according to the present disclosure the foam may have a thermoplastic and/or a modified cross-linked material with a thermoplastic elastomer (TPE).

In particular it is interesting that the material containing the compound according to examples of the disclosure can be heated very quickly and transmits its energy over a substantially longer time period. Additionally it is very worthy of note that the material according to examples of the disclosure has a very advantageous pore structure because this pore structure is evenly distributed and uniform. The cause of this is the high proportion of nanoscale compound according to examples of the disclosure, which acts as a strong nucleation agent. The pore structure can still be considerably improved by suitable process management.

In specific advantageous embodiments according to the disclosure the foam may in particular contain a material selected from the group consisting of polyethylene (PE), polypropylene (PP), polystyrene, in particular such as extruded polystyrene hard foam (X-PS), thermoplastic elastomer (TPE) and/or mixtures thereof.

In some advantageous embodiments according to the disclosure the flameproofing agent according to the disclosure may be present in a foam containing a polyurethane or consisting thereof.

In further advantageous embodiments according to the disclosure the foam may be closed-celled and/or open-celled.

In certain advantageous embodiments according to the disclosure the foam may in particular have a specific weight of 15 to 800 kg/m$^3$.

The flame-retardant or flameproofing characteristics of the flameproofing agents according to the disclosure discussed above can advantageously be combined in a targeted and controlled manner with the heat-storing, heat absorbing, heat insulating and/or sound-insulating and/or soundproofing characteristics of the flameproofing agents according to examples of the disclosure, in order to achieve positive multiple effects.

At present for the most part there are insulating materials (for application in construction, both internal fittings and also external construction) on the market which, from the technical point of view, have insufficient or even no flameproofing or which, if flame-resistant, are provided with the problematic organohalogen flameproofing agents and/or the synergist antimony trioxide, which is also registered as toxic, carcinogenic and/or mutagenic and is subject to strict monitoring by the regulators.

The provision of the environmentally friendly halogen-free flameproofing agent magnesium hydroxide, for example, has the disadvantage of a high load factor, which is necessary in order to obtain a substantial flameproofing, for example according to DIN/ISO 4102-B (part 1 or 2). Furthermore such a provision is expensive.

In this case the formulation of the compound through the particle size distribution of the MDH poses problems: In insulating foams the ideal pore size is as small as possible, in order to keep the mobility of the included gases as low as possible. The aim of this is to maximize the insulation effect. In order to obtain the smallest pores possible, a nucleation agent is necessary, which itself is as fine as possible, preferably in the nanoscale range.

The material according to examples the disclosure has a very high proportion of particles in the region of 600 nm, with a second peak in the particle size distribution curve in the region of 1.2 micrometers. In the foaming process with the flameproofing according to the disclosure, this advantageously has the effect that a corresponding number of nanoscale pores are produced.

Nanoscale MDH is currently in the development phase and correspondingly more expensive than conventional MDH. Therefore, because of the high price its use in mass systems is not currently advantageous. As a result, because of its production process nanoscale MDH has a very low bulk density and a very high surface energy. This leads to problems in the compounding ("wetting-out") and in the formation in particular of structural parts.

On the other hand, the flameproofing agent according to examples of the disclosure MKRS-HT and/or MR2S-NT has a high bulk density and a low surface energy. Thus advantageously it is possible to avoid and/or to prevent the problems occurring with MDH in the compounding and/or in the formation, in particular for example in the extrusion in particular of structural parts. Furthermore the surface energy of the flameproofing agent according to examples of the disclosure can advantageously be further improved and/or positively influenced by the surface modification described above.

By comparison with nanoscale MDH, the flameproofing agent MKRS-HT and/or MR2S-NT according to examples of the disclosure, even if it is not modified, can for example be incorporated very easily and with a high throughput capacity, i.e. very cost effectively, in a polymer matrix.

As a result, in connection with the favorable price for the flameproofing agent according examples of to the disclosure MKRS-HT and/or MR2S-NT, not only technical advantages but also fields of application which favor processing are revealed in which the price of conventional halogen-free flameproofing agents, such as for example MDH, in particular nanoscale MDH, are prohibitive.

Only the flameproofing agent MKRS-HT and/or MR2S-NT according to examples of the disclosure enables composites to be produced, which are flameproof halogen-free and also have an insulation effect and/or heat storage effect and/or soundproofing effect and/or shielding effect for electromagnetic fields.

Examples

Production of the Test Specimen:

The basic process set out below for producing the test specimen (granulate preparation) is identical for the advantageous uses of the flameproofing agent according to examples of the disclosure for heat insulation, heat absorption, sound absorption, sound insulation and/or heat storage and/or electromagnetic shielding.

By means of a compounding machine (BUSS co-kneader MDK 46-11 D/GS 46 with two ELT (inlet funnels) and triple degassing the flameproofing agent (MKRS-HT and/or MR2S-NT) according to examples of the disclosure and a polymer (EVA; Escorene Ultra UL 00119 from ExxonMobil) is homogeneously mixed and then granulated at a temperature of 135° C. The granules are tested for homogeneity and air inclusions.

The granules are then compressed on a heated and coolable double-plate press in mirror-polished dies to form panels with the dimensions 200×200×3.2 and 200×200×1.6 mm and these pressing plates are cooled under pressure in the die.

The resulting panels are equilibrated for 2 days in the standard climate (23° C., 50% relative room humidity) and then tested.

The fire test is carried out according to UL 94 vertical test specimens of 150 mm×12.7 mm×specimen thickness cut out of the panels.

Test specimens consisting of the polymer and 55% by weight and 65% by weight of magnesium hydroxide (Magnifin H 5; from Veitscher Magnesitwerke, Austria) serve as comparison.

The comparison test specimens and the test objects with 55% by weight and 65% by weight of the flameproofing agents (MKRS-HT and/or MR2S-NT) according to examples of the disclosure result at 3.2 mm test object thickness in a classification according to UL 94 of V-0.

Thus the flame resistance of the compound produced with the flameproofing agent (MKRS-HT and/or MR2S-NT) according to examples of the disclosure is demonstrated.

Furthermore the disclosure relates in some examples to the use of the flameproofing agent according to examples of the disclosure for attenuation or shielding of electromagnetic radiation.

Radiation is understood to be the free propagation of energy in space. In this case a distinction is made between particle radiation and electromagnetic radiation. The former consists of charged or uncharged particles which have a mass and propagate more slowly than light. The latter, also referred to as photon radiation, consists of a periodically changing electrical and magnetic field. This includes in addition to the visible light, ultraviolet rays and thermal radiation, also X-ray, cosmic and gamma radiation. Electromagnetic radiation is characterized by wavelength, frequency and amplitude and its propagation speed amounts in a vacuum is approximately the speed of light.

If photon radiation impinges on matter it is attenuated by absorption or scattering. The attenuation of the radiation following an exponential regularity facilitates a theoretically infinite range of radiation. The extension of the attenuation is generally dependent upon the body density, the atomic number of the atoms concerned and the penetrated material layer thickness.

In this connection it has been established according to the disclosure that the flameproofing agent according to examples of the disclosure (MKRS-HT and/or MR2S-NT or MS types) exhibits an attenuating and/or shielding effect on electromagnetic radiation, in particular on electrosmog.

The expression "electrosmog" is understood below inter alia to be an excessive "concentration" of electromagnetic fields with effects which are possibly harmful to health of living nature, in particular humans, animals, plants, other living creatures and individual cells, such as for example mobile phone radiation and/or low-frequency magnetic fields, for example of high voltage lines, etc.

In specific advantageous embodiments of the use according to the disclosure the electromagnetic radiation is in particular low-frequency electrical and/or magnetic fields.

In other specific advantageous embodiments of the use according to the disclosure the electromagnetic radiation is in particular mobile phone radiation.

In some advantageously embodiments of the disclosure the flameproofing agent according to the disclosure is used for EMP (in English: electromagnetic protection) applications.

In other advantageous embodiments of the disclosure the flameproofing agent (MKRS-HT and/or MR2S-NT) according to the disclosure is used for attenuation or shielding of electromagnetic radiation in a frequency range of between 1 Hz and 10 GHz.

In specific advantageous embodiments of the disclosure the flameproofing agent (MKRS-HT and/or MR2S-NT)

according to the disclosure is mixed with one or more polymers. As a result they can be brought into any shape and/or can also be chemically and/or physical foamed. Furthermore in this way the production of shielded spaces of any shape or also packages of sensitive electronic and/or electrical equipment is advantageously facilitated.

In further advantageous embodiments of the disclosure one or more polymers, which are mixed at least with one of the flameproofing agents according to the disclosure (MKRS-HT and/or MR2S-NT) in changing percentages, have a conductivity which facilitates the conduction of an electrical current, in particular as in a conductor. As a result for example a Faraday cage is formed.

In further advantageous embodiments of the disclosure one or more polymers, which are mixed at least with one of the flameproofing agents according to the disclosure (MKRS-HT and/or MR2S-NT) in changing percentages, are formed as a film. As a result for example a room to be shielded is lined or coated and thus a Faraday cage is formed. This lightweight and economically produced Faraday cage advantageously protects the interior of the room against electromagnetic pulses and thus prevents them from being coupled into the interior of the room and any electrical and/or electronic systems located there. Thus people located in the room can also be advantageously protected against the so-called electro-smog. The Faraday cage can also advantageously be installed invisibly and "concealed" in the form of the quoted film.

In other specific advantageous embodiments of the disclosure provision may also be made for using for example an elastomer-modified polyurethane as polymer, in order to produce a conductive (in particular industrial) floor covering. Such a covering can advantageously conduct a charge away from the human body and thus render it harmless for electronic components. Such a covering can also be used advantageously in many areas where conductive bases are prescribed, in particular in industry, in order to avoid the danger of (inter alia dust) explosions, caused by static charge.

In further advantageous embodiments of the disclosure the flameproofing agent according to the disclosure is used in a structural part, in particular in an electrical and/or an electronic structural part and/or in a circuit.

In further advantageous embodiments of the disclosure the flameproofing agent according to the disclosure is used for production of a structural part, in particular a structural part which is suitable and/or provided for reduction or shielding of electromagnetic radiation.

In further advantageous embodiments of the disclosure the flameproofing agent (MKRS-HT and/or MR2S-NT) according to the disclosure is used together with a thermoplastic, thermosetting and/or elastomeric material. In this case it may advantageously be provided that the proportion of the flameproofing agent is in particular 50 to 98% by weight, based on the structural part.

The flame-retardant or flameproofing characteristics of the flameproofing agents according to examples of the disclosure discussed above can advantageously be combined in a targeted and controlled manner with the heat-storing, heat absorbing, heat insulating and/or sound-insulating and/or soundproofing and/or radiation attenuating and/or radiation shielding characteristics of the flameproofing agents according to examples of the disclosure, in order to achieve positive multiple effects.

The invention claimed is:

1. An inorganic, halogen-free flameproofing agent produced from modified, recarbonized red mud (MKRS-HT) with a mineral composition of 10 to 50% by weight of iron compounds,
12 to 35% by weight of aluminum compounds,
5 to 17% by weight of silicon compounds,
2 to 10% by weight of titanium dioxide,
0.5 to 6% by weight of calcium compounds, characterized in that the weight ratio of Fe (II) carbonate to the oxides of iron is at least 1.

2. An inorganic, halogen-free flameproofing agent produced from modified, recarbonized and rehydrated red mud with a mineral composition of 10 to 50% by weight of iron compounds,
12 to 35% by weight of aluminum compounds,
5 to 17% by weight of silicon compounds,
2 to 10% by weight of titanium dioxide,
0.5 to 6% by weight of calcium compounds, characterized in that the weight ratio of Fe (II) carbonate to the oxides of iron is at least 1, and the weight ratio of the sum of iron hydroxide and iron oxide hydroxide to the oxides of iron is at least 1.

3. The flameproofing agent according to claim 1, wherein the proportion of water-soluble sodium compounds, expressed in percentage by weight of $Na_2O$ is no more than 0.03% by weight.

4. The flameproofing agent according to claim 1, wherein the average particle size (d50) is no more than 50 µm.

5. The flameproofing agent according to claim 1, wherein the residual moisture content is no more than 0.4% by weight.

6. The flameproofing agent according to claim 1, wherein the surface of the modified red mud is provided with at least one substance which improves the compatibility of the particles of the modified red mud with a polymer matrix.

7. The flameproofing agent according to claim 6, wherein the substance is a surface modifying agent, selected from the group consisting of organosilanes, organotitanates, organozirconium aluminates, carboxylic acid derivatives, softeners, oligomer and polymer precursors, ionomers, boric acid and the metal salts and derivatives thereof, zinc stannates, zinc hydroxystannates or combinations thereof.

8. The flameproofing agent according to claim 7, wherein the flameproofing agent is present in combination with synergists, in particular organoclays (nanoclays), tin compounds and borates.

9. The flameproofing agent according to claim 8, wherein the flameproofing agent also contains at least one further flame-retardant additive in a proportion up to 70% by weight.

10. The flameproofing agent according to claim 9, wherein at least one of the further flame retardant additives is an endothermally reacting substance.

11. A method for producing an inorganic, halogen-free flameproofing agent according to claim 1, comprising the steps of:

a) providing red mud,
b) reducing the iron (III) compounds contained in the red mud in acidic solution to iron (II) compounds, and
c) adding a carbonate compound to the solution containing iron (II) compounds obtained in step b), wherein iron (II) carbonate (siderite) is formed.

12. A method for producing an inorganic, halogen-free flameproofing agent according to claim 1, comprising the steps of:
a) providing red mud,
b) separately producing iron (II) carbonate from available starting substances;
c) mixing red mud and iron (II) carbonate;
d) obtaining modified carbonised red mud (MKRS-HT).

13. A fireproofed material system comprising a combustible material and a flameproofing agent as claimed in claim 1.

14. The material system according to claim 13, wherein the combustible material is a building material, a rubber product, a chipboard, a facade cladding or a plastic product, in particular a cable sheathing, cable insulation compound or a cable filling compound.

15. The material system according to claim 14, wherein the material system contains the flameproofing agent in a proportion of 3 to 95% by weight.

16. A method for producing a fireproofed material system comprising the steps of:
a) providing a combustible material,
b) coating or blending the combustible material with the flameproofing agent according to claim 1, and thereby
c) obtaining the fireproofed material system.

17. The method according to claim 16, wherein before the coating or blending in step b) the flameproofing agent is physically treated.

18. The method according to claim 17, wherein the flameproofing agent referred to in step b) is subjected to a surface modification.

19. The method according to claim 18, wherein the surface modification of the flameproofing agent comprises providing the surface of the flameproofing agent with a surface modifying agent which is selected from the group consisting of organosilanes, organotitanates, organo-zirconium aluminates, carboxylic acid derivatives, softeners, oligomer and polymer precursors, ionomers, boric acid and the metal salts and derivatives thereof, zinc stannates, zinc hydroxystannates or combinations thereof.

20. The method according to claim 17, characterized in that when used with the flameproofing agent in elastomeric, thermoplastic and thermosetting systems in the form of so-called "master batches" the synergists are added in liquid, paste or granule form during the processing.

21. A material system comprising:
the inorganic halogen-free flameproofing agent of claim 1, and at least one of:
one or more organic halogen flameproofing agents; and
one or more metal oxides.

* * * * *